(12) United States Patent
Anderson et al.

(10) Patent No.: US 11,892,487 B2
(45) Date of Patent: Feb. 6, 2024

(54) SENSING OVER A SHARED PHYSICAL CHANNEL

(71) Applicant: SENSOR HOLDINGS LIMITED, Penrose (NZ)

(72) Inventors: Iain Alexander Anderson, Auckland (NZ); Andreas Tairych, Auckland (NZ)

(73) Assignee: SENSOR HOLDINGS LIMITED, Auckland (NZ)

( * ) Notice: Subject to any disclaimer, the term of this patent is extended or adjusted under 35 U.S.C. 154(b) by 739 days.

(21) Appl. No.: 16/496,736

(22) PCT Filed: Mar. 23, 2018

(86) PCT No.: PCT/NZ2018/050036
§ 371 (c)(1),
(2) Date: Sep. 23, 2019

(87) PCT Pub. No.: WO2018/174730
PCT Pub. Date: Sep. 27, 2018

(65) Prior Publication Data
US 2020/0319236 A1 Oct. 8, 2020

(30) Foreign Application Priority Data

| Mar. 23, 2017 | (AU) | ................................ 2017901043 |
| Aug. 23, 2017 | (AU) | ................................ 2017903402 |
| Sep. 26, 2017 | (AU) | ................................ 2017903892 |

(51) Int. Cl.
*G01R 27/26* (2006.01)
*G01B 7/16* (2006.01)

(52) U.S. Cl.
CPC ........... *G01R 27/2605* (2013.01); *G01B 7/22* (2013.01)

(58) Field of Classification Search
CPC ............ G01R 27/2605; G01R 27/2635; G01R 27/2682; G01R 15/12; G01R 27/26; G01D 5/24; G01B 7/22; G01B 7/085; G01B 7/16
See application file for complete search history.

(56) References Cited

U.S. PATENT DOCUMENTS

2010/0033196 A1* 2/2010 Hayakawa ........... G01D 5/2412
324/686

FOREIGN PATENT DOCUMENTS

| WO | WO-2014174502 A2 * | 10/2014 | ............. G01D 3/024 |
| WO | WO-2016003293 A1 * | 1/2016 | ............... G01B 7/22 |

* cited by examiner

*Primary Examiner* — Tarun Sinha
*Assistant Examiner* — James I Burris
(74) *Attorney, Agent, or Firm* — MH2 TECHNOLOGY LAW GROUP, LLP

(57) ABSTRACT

In one aspect the invention provides a sensing apparatus comprising a set of N capacitive sensors connected over a single physical channel provided by two terminals, the apparatus comprising: a sensing array having a first capacitive sensor and N−1 parallel capacitive sensors each connected in parallel with first capacitive sensor, each capacitive sensor having electrodes separated by a dielectric to provide a capacitance which is able to vary with deformation to provide sensing, the array having a set of N−1 resistances each being in series with a respective one of the N−1 parallel capacitive sensors; a solution module operable to determine the capacitance of each capacitive sensor by finding solutions for a vector function equating reactance measured at the two terminals to an analytical model for impedance and/or reactance of the circuit seen at the two terminals, wherein the analytical model comprises N capacitances, each connected in parallel with each other, and comprises N series resistances each connected in series with a respective capacitance.

5 Claims, 15 Drawing Sheets

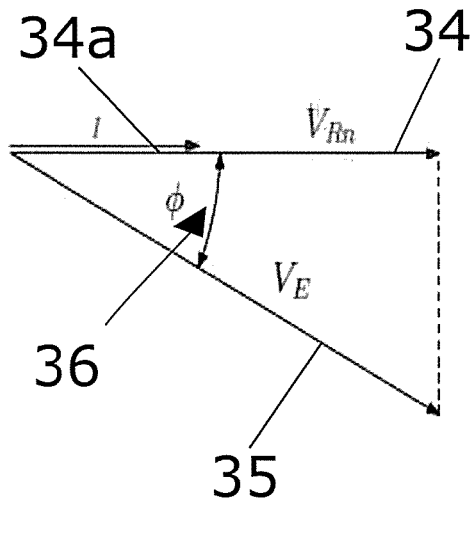
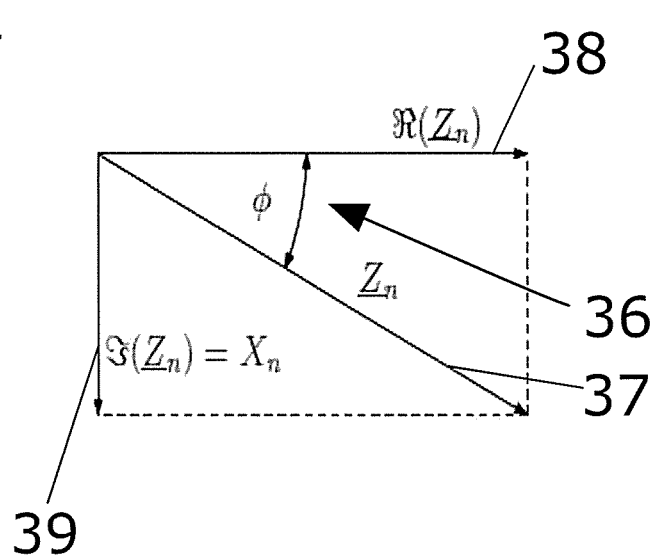
Figure 4a     Figure 4b
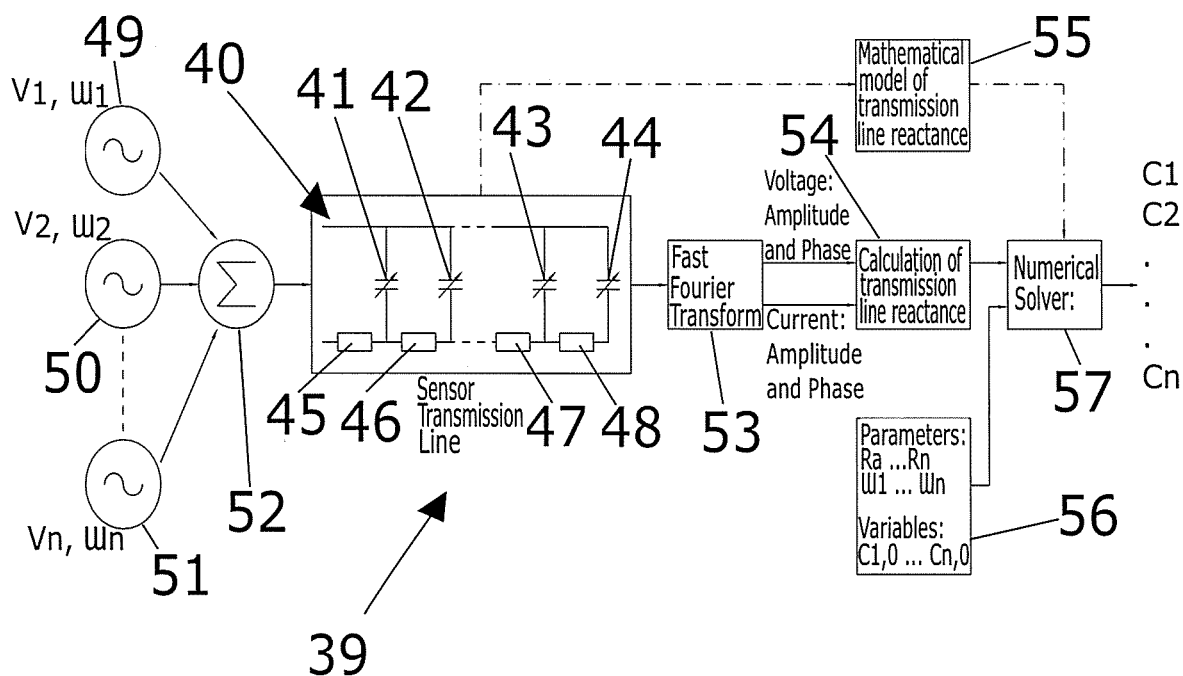
Figure 5

SENSING OVER A SHARED PHYSICAL CHANNEL

CROSS REFERENCE TO RELATED APPLICATIONS

This application is a U.S. National Stage entry of PCT/NZ2018/050036, filed Mar. 23, 2018, which claims priority to AU Application No. 2017901043, filed Mar. 23, 2018; AU Application No. 2017903402, filed Aug. 23, 2017; and AU Application No. 2017903892, filed Sep. 26, 2017, the contents of all of which are hereby incorporated by reference in their entirety.

FIELD OF THE INVENTION

This invention relates to improvements in respect of sensing of characteristics of electronic circuits, such as soft electronic circuits and, more specifically, such as soft electronic circuits which have electronic characteristics which vary with deformation to allow sensing. More specifically the present invention relates to improvements of sensing for soft circuits with soft capacitors. More specifically this invention relates to sensing with multiple sensors over a shared physical channel.

BACKGROUND OF THE INVENTION

Wearable motion capture system may be based on soft electronic circuits, such as deformable sensors. These typically require an additional component for signal transfer and processing.

Sensing electronics are typically implemented on rigid circuit boards.

If every sensor was connected to a separate physical channel, the circuit board footprint taken up by the connectors would potentially be significant and would result in a larger circuit board area than is desirable.

If electrical connections between a sensing circuit and each sensor were established through a separate set of non-stretchable wires the result would be a considerable number of rigid components added to a sensing device that is intended to be soft and unobtrusive. This could mean advantages of soft sensors are cancelled by the overhead of non-stretchable components such as wires.

It would therefore be of advantage to have soft electronic circuits which could address any or all of the above problems, or at least provide the public with an alternative choice.

It would therefore be of advantage to have a sensing apparatus for soft electronic circuits which could address any or all of the above problems, or at least provide the public with an alternative choice.

DISCLOSURE OF THE INVENTION

In one aspect the invention provides a sensing apparatus comprising a set of N capacitive sensors connected over a single physical channel provided by two terminals, the apparatus comprising:

a sensing array having a first capacitive sensor and N−1 parallel capacitive sensors each connected in parallel with first capacitive sensor, each capacitive sensor having electrodes separated by a dielectric to provide a capacitance which is able to vary with deformation to provide sensing, the array having a set of N−1 resistances each being in series with a respective one of the N−1 parallel capacitive sensors;

a solution module operable to determine the capacitance of each capacitive sensor by finding solutions for a vector function equating reactance measured at the two terminals to an analytical model for impedance and/or reactance of the circuit seen at the two terminals, wherein the analytical model comprises N capacitances, each connected in parallel with each other, and comprises N series resistances each connected in series with a respective capacitance.

In another aspect the invention provides a device operable to measure capacitances and/or resistances in an array of sensors arranged in a circuit having N capacitances arranged in parallel with each other, the device being operable to connect to the array over a single physical channel provided by two terminals and being operable to provide at the two terminals an excitation signal for the array, the excitation signal having N frequency components, and operable on data carrying information on a vector function to determine values of capacitance and/or resistances for the array of sensors, the vector function operable to equate at each of the N frequency components:

a) impedance measured at the two terminals to;
b) an analytical expression approximating the circuit provided in combination by the array and connected device as a set of N capacitances C1 to CN, each in parallel with each other and each having a resistance in series with a respective one of the capacitances capacitance and may define impedance ZN by the expression $$Z_N = R_N + \cfrac{1}{j\omega_i C_N + \cfrac{1}{R_{N-1} + \cfrac{1}{j\omega_i C_{N-1} + \cfrac{1}{\vdots \\ R_2 + \cfrac{1}{j\omega_i C_2 + \cfrac{1}{R_1 + \cfrac{1}{j\omega_i C_1}}}}}}}$$

ωi=2πfi where i=1 to N, where C1 is the first capacitance, C2 is the second capacitance, where CN−1 is the N−1$^{th}$ capacitance, Cn is the nth-capacitance, R1 is the series resistance of the first capacitance, R2 is the resistance of the second capacitance, RN−1 is the series resistance of the N−1$^{th}$ capacitance, and RN is the series resistance of the Nth-capacitance, where on is the angular frequency of the excitation signal, fi is the frequency of the excitation frequency component are applied to the circuit described by the impedance ZN. f1 is the first frequency, f2 is the second frequency, fN−1 is the N−1th-frequency, and fN is the Nth-frequency.

The array, in combination with the measuring device, may comprise N resistances of selected and known value, each resistance being in series with a respective capacitance.

The array in combination with the device may comprise a set of M resistances of selected and known value and N-M capacitances of selected and known value.

The array in combination with the device may comprises any number of N or less capacitances to be determined and N or less resistances to be determined and the method comprises operations equating both the real components and imaginary components of impedance measured at the two terminals and the analytical expression approximating the circuit.

The N or less resistances may be circuit equivalent resistances to resistances of deformable leads of the array which vary in resistance with deformation.

In another aspect the invention provides a sensing apparatus comprising:
- a sensing circuit having an array of N capacitive sensors, each connected in parallel with each other and with first and second sensing terminals, and having a set of N sensing resistors each having a selected resistance, and each connected in series with a respective capacitive sensor;
- an excitation module operable to provide an excitation voltage signal with N frequency components at the sensing terminals to induce a current in the sensing circuit;
- an impedance measurement circuit operable to measure impedance of the sensing circuit; and
- a solution module operable to solve a vector function which equates at the N frequency components of the excitation signal measured impedance of the sensing circuit to data carrying information on an expression of analytical impedance of a sensing circuit, the analytical impedance having N sensor capacitances in parallel with each other and in parallel with the first and second sensing terminals and having N resistances each connected in series with a respective one of the N sensor capacitances.

A capacitive sensor may comprises a capacitor formed of electrodes having a resistance and the sensing resistances are selected to be greater than the resistance of the electrodes of the respective capacitive sensor to which the selected resistance is connected in series.

The series resistances may be selected to be greater than a resistance of the electrodes of the respective capacitive sensor to which the selected resistance is connected in series.

One aspect of the present invention provides a circuit formed of soft electronic components comprising:
- a first soft capacitor able to deform and operable to change capacitance as it deforms to allow sensing of deformation;
- a second soft capacitor able to deform and operable to change capacitance as it deforms to allow sensing of deformation, the second capacitive sensor arranged in parallel with the first capacitive sensor;
- a first pair of soft conductive leads provided for the first capacitive sensor,
- the first pair of conductive leads able to deform, and the first pair having a resistance which is able to be represented as a first series lead resistance in series with the first capacitive sensor;
- a second pair of soft conductive leads provided for the second capacitor, the second pair of conductive leads able to deform, and the second pair of conductive leads having a resistance which is able to be represented as a second series lead resistance in series with the second capacitive sensor;
- a set of excitation terminals arranged so as to receive a voltage signal to excite the first capacitive sensor and the second capacitive sensor.

The circuit may comprise a set of sensing terminals arranged so as to provide a voltage to a sensing apparatus wherein the voltage proportional to the current through the sensor array circuit.

Another aspect of the present invention provides a sensing apparatus operable to connect to excitation terminals of a soft electronic circuit and sensing terminals of a soft electronic circuit to sense the electronic characteristics of one or more of the first capacitive sensor, the second capacitive sensor, the first series lead resistance and the second series lead resistance when the sensor is excited with a voltage signal comprising first and second frequency components, the sensing apparatus comprising an impedance module operable to determine the impedance of the circuit at first and second frequency components.

An alternative aspect of the present invention provides a sensing apparatus operable to connect to the excitation terminals of a soft electronic circuit and comprising a shunt resistance for the circuit to provide a sensing voltage signal proportional to the current through the circuit, the sensing apparatus operable to sense the electronic characteristics of one or more of the first capacitive sensor, the second capacitive sensor, the first series lead resistance and the second series lead resistance when the sensor is excited with a voltage signal comprising first and second frequency components, the sensing apparatus comprising an impedance module operable to determine the impedance of the circuit at first and second frequency components.

The sensing apparatus wherein the impedance module may be operable to determine, dependent on the excitation voltage signal and sensing voltage signal, real and imaginary components of an impedance of the circuit at first and second frequency components.

The sensing apparatus wherein the impedance module may be operable to determine the real and imaginary components of the impedance of the circuit dependent on data carrying information on a phasor for the excitation voltage signal at first and second frequency components and carrying information on a phasor for the sensing voltage signal at first and second frequency components.

The sensing apparatus wherein the impedance module may be operable to determine the resistance and reactance of the sensor device at first and second frequency components dependent on data carrying information on a phasor for the excitation voltage signal at first and second frequency components and carrying information on the sensing voltage signal at first and second frequency components.

The sensing apparatus comprising an electronic characteristic solution module operable to determine a capacitance for the first capacitor, a capacitance for the second capacitor, the first resistance, the first series lead resistance and the second series lead resistance of the connected sensor circuit dependent on:
- an imaginary component of a measured impedance of the soft electronic circuit at first and second frequency components of the excitation voltage signal,
- a real component of a measured impedance of the soft electronic circuit at first and second frequency components of the excitation voltage signal, an imaginary component of a vector function defined by an analytical model of impedance of the soft electronic circuit the vector function dependent on the frequency components of the excitation signal;
- a real component of the vector function defined by an analytical model of impedance of the soft electronic circuit the vector function dependent on the frequency components of the excitation signal; and the frequencies of the first and second frequency components of the excitation signal.

The sensing apparatus operable to equate, at each of the frequencies of the components of the excitation signal, the imaginary component of the measured impedance to an imaginary component of the vector function and to equate, at each of the frequencies of the components of the excitation signal, the real component of the measured impedance of the circuit to the real component of the vector function for the model for the impedance of the circuit.

The sensing apparatus operable to define data carrying information on a set of 2N equations, where N is the number of excitation voltage frequency components, to find each of the series lead resistances and each of the capacitances.

The soft electronic circuit may be an array of deformation sensors.

The sensing apparatus may be operable to sense deformation corresponding to values of capacitors or resistors in the soft electronic circuit.

The sensing apparatus may be operable to determine a deformation metric dependent on the electronic characteristic of the first and second variable capacitors.

The sensing apparatus may be operable to determine a deformation metric dependent on first and second capacitance values determined and dependent on calibration data relating deformation to capacitance.

The sensing apparatus may be operable to determine a deformation metric dependent on first and second capacitance values determined and dependent on calibration data relating deformation to change in capacitance.

Aspects of the present invention comprise a sensing apparatus operable to determine values for electronic components in a circuit having N capacitances arranged in parallel with each other and N resistances arranged with a circuit equivalent of a resistance in series with each of the N capacitances the circuit having first and second excitation terminals arranged to receive an excitation voltage signal for the N capacitances and N resistances, the apparatus operable to measure at N frequency components the real and imaginary components of the impedance of the circuit dependent on the sensing voltage signal and the excitation signal, wherein the sensing apparatus is operable to numerically solve a set of 2N equations of a function provided by equating at each of the N frequency components the real component of a model for impedance of the circuit to the measured real component of impedance for the circuit and by equating the at each of the N frequency components the imaginary component of a model for impedance of the circuit to the measured imaginary component of impedance for the circuit.

The sensing apparatus may comprise a shunt resistance of known value and the two sensing terminals arranged across the shunt resistance for the circuit so as to provide a voltage signal proportional to the current through the circuit.

The apparatus may be operable to measure the impedance of the circuit dependent on data carrying information on phasors for current through and voltage across the circuit.

The sensing apparatus may be operable to sense a degree of deformation occurring in soft capacitors in the circuit wherein the soft capacitors are operable to deform and vary capacitance as they deform.

One aspect of the present invention provides an electronic circuit comprising:
 a first capacitor able to change capacitance;
 a second capacitor able to change capacitance, the second capacitive sensor arranged in parallel with the first capacitive sensor;
 a first pair of resistive leads provided for the first capacitive sensor, the first pair of conductive leads able to be represented as a first series lead resistance arranged in series with the first capacitive sensor and having a resistance which varies with deformation of the leads;
 a second pair of conductive leads provided for the first capacitive sensor, the second pair of conductive leads able to be represented as a second series lead resistance in series with the second capacitive sensor; a set of excitation terminals arranged so as to receive a voltage signal to excite the first capacitive sensor and the second capacitive sensor;
 a set of sensing terminals arranged so as to provide a voltage to a sensing apparatus wherein the sensing voltage is proportional to the current through the sensor array circuit.

Aspects of the present invention comprise a process to determine values for electronic components in a circuit having N capacitances arranged in parallel with each other and N resistances arranged with a circuit equivalent of a resistance in series with each of the N capacitances the circuit having first and second excitation terminals arranged to receive an excitation voltage signal for the N capacitances and N resistances, the process comprising the steps of measuring at N frequency components real and imaginary components of the impedance of the circuit;
 numerically solving a set of 2N equations of a vector function provided by equating at each of the N frequency components, the real component of a model for impedance of the circuit to the measured real component of impedance for the circuit and by equating the at each of the N frequency components the imaginary component of a model for impedance of the circuit to the measured imaginary component of impedance for the circuit.

Aspects of the present invention provide a sensor comprising a soft electronic circuit operable to deform and to change one or more electronic characteristics with deformation, wherein the circuit comprises two or more soft capacitors having a capacitance characteristic which changes with deformation, wherein the two or more capacitors are arranged in parallel with each other, the circuit further comprising soft conductive leads for the capacitors.

Resistance of the electrodes of the capacitors may be less than resistance of the leads by a factor.

The factor may be greater than 10. The factor may be greater than 100.

Resistance of the electrodes of the capacitors may be negligible compared to resistance of the leads by a factor.

Aspects of the present invention comprise an apparatus operable to determine electrical characteristics of a circuit having two or more capacitors arranged in parallel the resistors connected by resistive leads wherein the apparatus is operable to define data which carries information equating impedance measured for the circuit to information on a model of the impedance of the circuit.

The apparatus may be operable to find a numerical solution for a set of equations at each of a number of frequency components of an excitation voltage signal applied to the circuit.

The apparatus may be operable to equate a real component of the measured impedance to a real component of model of the circuit at a set of frequency components of the excitation signal.

The apparatus may be operable to equate an imaginary component of the measured impedance to an imaginary component of the model of the circuit at a set of frequency components of the excitation signal. The model may be a transmission line model.

The model may represent the resistance of a pair of leads for a capacitor to a single series resistance for the capacitor.

The model may assume an infinite leakage resistance for the capacitors.

The model may assume a negligible electrode resistance for the capacitors.

The apparatus may be operable to measure impedance at a frequency component of the excitation signal by relating phasor data defining a phasor for the excitation voltage signal at the frequency component to a data defining a phasor for the current through the circuit at the frequency component.

Aspects of the present invention provide an array of deformable capacitive sensors operable to stretch to vary capacitance of the sensors arranged in a circuit as a series of N capacitances and N−1 resistances arranged with a capacitance and series resistance for that capacitance arranged in parallel with a previous capacitance in the series, wherein each resistance has a known value.

This provides a circuit in which the capacitive sensors can be via a pair of wires and allows the reactance of the circuit. Measurement of the reactance of the circuit at the wires may be equated to an analytical expression of the reactance at known frequencies of a voltage signal which charges the sensors and with known resistances used in the analytical expression a set of equations at N known frequencies can be solved to find the N capacitances. This provides a sensor with N deformation sensors for which the individual capacitance can be measured over single channel of two wires.

Aspects of the present invention provide a circuit comprising an array of capacitive sensors of variable capacitance arranged in a circuit as N capacitances in parallel and comprising N−1 series resistances of known resistance arranged with a resistance in series with each of the N−1 capacitances to separate the capacitances, wherein the impedance of the circuit may be represented as $$Z_{n-1,n} = \frac{1}{i\omega C_n + \frac{1}{Z_{n-1}}}$$

if leakage resistance and electrode resistance of the capacitive sensors are neglected.

Aspects of the present invention provide a process for determining the capacitances of a circuit comprising a set of N capacitors arranged in parallel between a pair of terminals each capacitive sensor having a series resistor of known resistance by equating a) reactance of the circuit measured at the pair of terminals and b) a model of reactance of the circuit represented by capacitances each with a series resistance to provide a set of N equations with known reactance at N frequency components for the circuit, N known resistances and N unknown capacitances, the process further comprising and numerically solving the set of equations to find the N capacitances of the capacitive sensors.

A sensor array circuit comprising:
a first capacitive sensor;
a second capacitive sensor, the second capacitive sensor arranged in parallel with the first capacitive sensor;
a first sensing resistor having a first selected resistance and arranged in series with the first capacitive sensor;
a second sensing resistor having a second selected resistance being arranged in series with the second capacitive sensor and being arranged in parallel with the first capacitive sensor;
a set of excitation terminals arranged so as to receive a voltage signal to excite the first capacitive sensor and the second capacitive sensor;
a set of sensing terminals arranged so as to provide a voltage to a sensing circuit the voltage proportional to the current through the sensor array circuit.

The first sensing resistor may be arranged between an excitation terminal and a sensing terminal. The first capacitive sensor may be connected via wires to the excitation terminals. This will provide a sensor array for two capacitive sensors which requires only two points of connection to excitation terminals. The two excitation terminals may provide a single connection channel for the two capacitive sensors.

The first and/or capacitive sensor may be deformable and operable to and to vary in capacitance with deformation.

The first sensing resistor may be arranged between an excitation terminal and a sensing terminal. The first capacitive sensor may be connected via wires to the excitation terminals. This will provide a sensor array for two capacitive sensors which requires only two points of connection to excitation terminals. The two excitation terminals may provide a single connection channel for the two capacitive sensors.

The first and/or capacitive sensor may be operable to deform to and to vary in capacitance with deformation.

Excitation of a capacitive sensor may be with electrical charge.

The sensor array may be formed on flexible substrate material.

The capacitive sensors may comprise fabric electrodes.

The fabric electrodes may comprise a fabric with one or more threads of conductive material. The conductive material may be a metal.

The sensor array may be compliant.

One or more of the first and second capacitive sensors may be formed on a flexible material.

One or more of the first and second capacitive sensors may be flexible.

One or more of the first and second capacitive sensors may be compliant.

One or more of the first and second capacitive sensors may be stretchable and operable to change in capacitance with stretch.

The sensor array may have layout in which the first capacitive sensor has a defined alignment with respect to the second capacitive sensor.

The defined alignment may provide a mechanical coupling of deformation sensed by the first capacitive sensor and deformation sensed by the second capacitive sensor.

The defined alignment may provide a mechanical de-coupling of deformation sensed by the first capacitive sensor and deformation sensed by the second capacitive sensor.

The set of excitation terminals may be connected in series with the first sensing resistor to provide a voltage across the first sensing resistor.

The set of sensing terminals may be arranged connected across an excitation terminal and the first sensing resistor to receive a sensing signal comprising voltage across the first sensing resistor. This may provide a sensed voltage signal which is proportional to the current through the sensor.

In another aspect the invention provides a deformation sensing apparatus operable to connect to the excitation terminals and sensing terminals of the deformation sensor of any one of the paragraphs above to sense the capacitance of the first capacitive sensor and the capacitance of the second capacitive sensor when the sensor is excited with a voltage signal comprising first and second frequency components, the deformation measuring apparatus comprising a reactance module operable to determine the reactance of the sensor at first and second frequency components dependent on excitation signal and the sensing signal.

The reactance module may be operable to determine the reactance of the sensor apparatus dependent on data carrying information on a phasor for the excitation voltage signal and information on the sensing voltage signal at first and second frequency components.

The reactance module may be operable to apply a Fourier transform to the excitation voltage signal received at the excitation terminals and the sensing voltage signal.

The Fourier Transform may be a Fast Fourier Transform.

The deformation sensing apparatus may comprise a capacitance solution module operable to determine a capacitance for the first capacitive sensor and to determine a capacitance for the second capacitive sensor of the connected sensor dependent on:
- the reactance of the sensor apparatus at first and second frequency components of the excitation voltage signal, the first and second sensor resistances of the deformation sensor,
- a vector function for the deformation sensor at each of the first and second frequency components of the excitation signal; and
- the frequencies of the first and second frequency components of the excitation signal.

The capacitance solution module may be operable to determine individual capacitances of the first capacitive sensor and the second capacitive sensor.

The capacitance solution module may be operable to determine individual capacitances of the first capacitive sensor and the second capacitive sensor individually.

A vector function may equate reactance dependent on current and voltage to a model of reactance for the deformation sensor a frequency component of the excitation signal.

The model may have terms representing the first and second sensor resistors and capacitances for the first and second capacitive resistors.

The model may neglect a resistance of electrodes forming a capacitance of the first and/or second capacitive sensor. A resistance of electrodes may be treated as zero.

The model may neglect a leakage resistance of the first and/or second capacitive sensor. A leakage resistance may be treated as infinite.

The capacitance solution module may be operable to find a numerical approximation for the capacitance of the first capacitive sensor and the second capacitive sensor dependent the set of equations, a mathematical derivative of the set of equations and a convergence error between successive iterations of a numerical approximation.

The mathematical derivative may be a Jabobian matrix for a matrix representing a partial derivative of the vector function at first and second frequencies.

Other aspects of the invention comprise the deformation sensor of any one of the paragraphs above comprising a third sensor resistor and a third capacitive sensor.

Other aspects of the present invention comprise the reactance sensing module operable to sense the reactance of the deformation sensor at a frequency of a third frequency component.

In other aspects of the present invention the frequency components are determined by a filter to remove frequencies of a broad-spectrum excitation signal.

By selecting an analytical model of the sensor circuit which neglects leakage resistance of the capacitive sensors the capacitance solving module can treat a set of equations of analytical reactance determined for the model using known sensor resistances on one side and known reactances.

The first and second sensing resistors may be adapted such that sensing resistance may be substantially constant as the first or second capacitive sensors are deformed.

The sensor may have capacitive sensors and sensing resistors formed therein so as to provide an integrated sensor operable to sense first and second deformations of first and second capacitive sensors.

In one aspect the present invention provides a deformation sensor comprising:
- a first capacitive sensor operable to deform and to vary in capacitance with deformation,
- a second capacitive sensor operable to deform to and to vary in capacitance with deformation, the second capacitive sensor connected in parallel with the first capacitive sensor;
- a sensing resistor having a defined resistance, being connected in series with the second capacitive sensor and being connected in parallel with the first capacitive sensor;
- a set of excitation terminals connected to receive a voltage signal to excite the first capacitive sensor and the second capacitive sensor.

The resistance of the first resistor is approximately 10000 times the resistance of electrodes of the capacitive sensors.

The leakage resistance the capacitive sensors is approximately $10^{<9>}$ times the electrode resistance the capacitive sensors.

The first sensing resistor is approximately 1.5 times the resistance of the of the second sensing resistance.

In another aspect the invention provides a device comprising:
- a set of N capacitive sensors operable to vary in capacitance to provide a means of sensing;
- a set of N resistors of selected resistances,
- an excitation circuit operable to excite the set of capacitive components with a set of N excitation component frequencies,
- a reactance component operable to connect to the sensing channel to determine the reactance of the capacitive sensor components and resistance components as a set to provide measured reactance, the reactance determined at each at each of the N excitation component frequencies to provide measured reactance at each,
- a calculating component operable to find a numerical solution for the capacitances of the set of N sensors dependent on:
  the reactance at each of the N frequency components,
  ii) the resistance of each of the N interstitial resistance components; and
  the frequency of each of the N component frequencies of the excitation signal.

The calculating component may be operable to find a numerical solution for the capacitances of the set of N capacitive sensors using a set of vector functions defined by the measured reactance for each component frequency and analytical reactances of the N resistor components N capacitive sensor for each component frequency.

The capacitance of the capacitive characteristic may vary in a known relation to deformation to allow the capacitive characteristic to characterise deformation.

The first sensing resistor may have a value which is selected such that a model of the sensor resistance in series with the capacitive sensor wherein the model neglects any leakage resistance in the capacitive sensor which is in parallel with a capacitance of the sensor will approximate the electrical characteristics of the sensor resistance in series with the capacitive sensor. This approximation may be within a defined tolerance or error.

The approximation may be such that any leakage resistance in parallel with the capacitance is negligible.

A device operable to instrument multiple modes of deformation of a body over an electrical sensing channel, the device comprising:
- a set of N capacitive sensor components each operable to deform to provide a capacitive characteristic for a mode of deformation, the set of capacitors connected to the sensing channel,
- a set of N sensing resistor components of selected resistance separating the capacitive sensor components,
- an excitation circuit operable to excite the set of capacitive components with a set of N excitation component frequencies,
- a reactance component operable to connect to the sensing channel to determine the reactance of the capacitive sensor components as a set, the reactance determined at each at each of the N excitation component frequencies,
- a calculating component operable to find a numerical solution for the capacitance of the set of N sensors dependent on the reactance at each of the N frequency components,
- ii) the resistance of each of the N sensing resistance components and the frequency of each of the N component frequencies of the excitation signal.

A capacitance sensor operable to measure first and second variable capacitance comprising:
- a first capacitive sensor operable to vary in capacitance,
- a second capacitive sensor operable to vary in capacitance, the second capacitive sensor connected in parallel with the first capacitive sensor;
- a first sensing resistor having a first selected resistance and connected is series with the first capacitive sensor;
- a second sensing resistor having a second selected resistance being connected in series with the second capacitive sensor and connected in parallel with the first capacitive sensor;
- a set of excitation terminals connected to receive a voltage signal to excite the first capacitive sensor and the second capacitive sensor;
- a set of sensing terminals connected so as to provide a voltage to a sensing circuit the voltage proportional to the current between the excitation terminals.

A deformation sensor component operable to operable to connect to a capacitance measuring apparatus having a pair of terminals and a first resistor of selected resistance to allow measurement of a voltage which is proportional to current flowing in a connected component due to an excitation voltage signal, the deformation sensor component comprising:
- a first capacitive sensor able to deform and operable to vary in capacitance with deformation,
- a second capacitive sensor able to deform and operable to vary in capacitance with deformation, the second capacitive sensor connected in parallel with the first capacitive sensor;
- a second sensing resistor having a second selected resistance being connected in series with the second capacitive sensor and connected in parallel with the first capacitive sensor.

The sensor resistances may be in the order of 10000 times the electrode resistance of the capacitive sensor.

A sensor resistance may be selected dependent on a capacitance of a capacitive sensor so as to allow an excitation signal in the order of tens of kilo-Hertz to excite each of the capacitive sensors. Excite may comprise exciting so as to measure capacitance.

The deformation sensor may be formed on flexible material.

Aspects of the present invention provide an array of deformable capacitive sensors comprising one or more deformable capacitive components and one or more resistor components formed of a deformable conductive material bonded to a substantially non-stretchable material to resist stretching of the deformable conductive material.

The conductive material of the resistor component may be a matrix material comprising a dispersion of particles which provide a conductive property.

The conductive material may comprise an elastomer.

The resistivity of the resistive component may be more than about 10 kOhm.

The resistivity of the resistive component may be less than about 100 kOhm.

The resistivity of the resistive component may be more than 10 kOhm.

The resistivity of the resistive component may be in a range of 10 KOhm to 100 kOhm.

The capacitive component may comprise one or more electrodes formed of conductive fabric.

The one or more resistor components may extend from the capacitive component to provide a connection terminal for the capacitive component.

The one or more resistor components may be arranged with the conductive material in contact with an electrode of the capacitive component.

The array of deformable capacitive sensors may comprise two or more capacitive components one or more of the one or more resistor components connected between the capacitors.

Aspects of the present invention provide a resistor component comprising a deformable conductive material bonded to a substantially non-stretchable backing material.

Aspects of the present invention provide a resistor component comprising a layer of conductive material formed by depositing and curing a liquid or gel and comprising a substantially non-stretchable layer of backing material bonded to the conductive material.

Aspects of the present invention provide an electrical circuit comprising one or more capacitor components each formed of two or more layers of deformable conductive material forming capacitive electrodes, the capacitive components bonded to a fabric, the circuit also comprising one or more resistor components formed of conductive material bonded to stretch resistant material.

Aspects of the present invention comprise a stretchable electric circuit having one or more components bonded to a stretchable material, the circuit comprising one or more resistors formed of deposited conductive material bonded to a stretch-resistant material.

The one or more resistors may be arranged to have a selected resistivity.

The one or more resistors may be arranged to have a selected resistance.

Aspects of the present invention provide an array of deformable capacitive sensors operable to stretch to vary capacitance of the sensors arranged in a circuit as a series of N capacitances and N–1 resistances arranged with a capacitance and series resistance for that capacitance arranged in parallel with a previous capacitance in the series, wherein each resistance has a known value.

This provides a circuit in which the capacitive sensors can be connected to sensing electronics which measures the reactance of the circuit over two terminals. Measurement of the reactance of the circuit at the wires may be equated to an analytical expression of the reactance at known frequencies of a voltage signal which charges the sensors and with known resistances used in the analytical expression a set of equations at N known frequencies can be solved to find the N capacitances. This provides a sensor with N deformation sensors for which the individual capacitance can be measured over single channel of two wires.

Aspects of the present invention provide a circuit comprising an array of capacitive sensors of variable capacitance arranged in a circuit as N capacitances in parallel and comprising N−1 series resistances of known resistance arranged with a resistance in series with each of the N−1 resistances to separate the capacitances, wherein the impedance of the circuit may be represented as $$Z_{n-1,n} = \frac{1}{i\omega C_n + \frac{1}{Z_{n-1}}}$$

if leakage current and electrode resistance of the capacitive sensors are neglected.

Aspects of the present invention provide a process for determining the capacitances of a circuit comprising a set of N capacitors arranged in parallel between a pair of terminals each capacitive sensor having a series resistor of known resistance by equating a) reactance of the circuit measured at the pair of terminals and b) a model of reactance of the circuit represented by capacitances each with a series resistance to provide a set of N equations with known reactance at N frequency components for the circuit, N known resistances and N unknown capacitances, the process further comprising and numerically solving the set of equations to find the N capacitances of the capacitive sensors.

A sensor array circuit comprising:
a first capacitive sensor;
a second capacitive sensor, the second capacitive sensor arranged in parallel with the first capacitive sensor;
a first sensing resistor having a first selected resistance and arranged in series with the first capacitive sensor;
a second sensing resistor having a second selected resistance being arranged in series with the second capacitive sensor and being arranged in parallel with the first capacitive sensor;
a set of excitation terminals arranged so as to receive a voltage signal to excite the first capacitive sensor and the second capacitive sensor; and
a set of sensing terminals arranged so as to provide a voltage to a sensing circuit the voltage proportional to the current through the sensor array circuit.

The first sensing resistor may be arranged between an excitation terminal and a sensing terminal. The first capacitive sensor may be connected via wires to the excitation terminals. This will provide a sensor array for two capacitive sensors which requires only two points of connection to excitation terminals. The two excitation terminals may provide a single connection channel for the two capacitive sensors.

The first and/or capacitive sensor may be deformable and operable to and to vary in capacitance with deformation.

The first sensing resistor may be arranged between an excitation terminal and a sensing terminal. The first capacitive sensor may be connected via wires to the excitation terminals. This will provide a sensor array for two capacitive sensors which requires only two points of connection to excitation terminals. The two excitation terminals may provide a single connection channel for the two capacitive sensors.

The first and/or capacitive sensor may be operable to deform to and to vary in capacitance with deformation.

Excitation of a capacitive sensor may be with electrical charge.

The sensor array may be formed on flexible substrate material.

The capacitive sensors may comprise fabric electrodes.

The fabric electrodes may comprise a fabric with one or more threads of conductive material. The conductive material may be a metal.

The sensor array may be compliant.

One or more of the first and second capacitive sensors may be formed on a flexible material.

One or more of the first and second capacitive sensors may be flexible.

One or more of the first and second capacitive sensors may be compliant.

One or more of the first and second capacitive sensors may be stretchable and operable to change in capacitance with stretch.

The sensor array may have layout in which the first capacitive sensor has a defined alignment with respect to the second capacitive sensor.

The defined alignment may provide a mechanical coupling of deformation sensed by the first capacitive sensor and deformation sensed by the second capacitive sensor.

The defined alignment may provide a mechanical decoupling of deformation sensed by the first capacitive sensor and deformation sensed by the second capacitive sensor.

The set of excitation terminals may be connected in series with the first sensing resistor to provide a voltage across the first sensing resistor.

The set of sensing terminals may be arranged connected across an excitation terminal and the first sensing resistor to receive a sensing signal comprising voltage across the first sensing resistor. This may provide a sensed voltage signal which is proportional to the current through the sensor.

In another aspect the invention provides a deformation sensing apparatus operable to connect to the excitation terminals and sensing terminals of the deformation sensor of any one of the paragraphs above to sense the capacitance of the first capacitive sensor and the capacitance of the second capacitive sensor when the sensor is excited with a voltage signal comprising first and second frequency components, the deformation measuring apparatus comprising a reactance module operable to determine the reactance of the sensor at first and second frequency components dependent on excitation signal and the sensing signal.

The reactance module may be operable to determine the reactance of the sensor apparatus dependent on data carrying information on a phasor for the excitation voltage signal and information on the sensing voltage signal at first and second frequency components.

The reactance module may be operable to apply a Fourier transform to the excitation voltage signal received at the excitation terminals and the sensing voltage signal.

The Fourier Transform may be a Fast Fourier Transform.

The deformation sensing apparatus may comprise a capacitance solution module operable to determine a capacitance for the first capacitive sensor and to determine a capacitance for the second capacitive sensor of the connected sensor dependent on:
the reactance of the sensor apparatus at first and second frequency components of the excitation voltage signal, the first and second sensor resistances of the deformation sensor, a vector function for the deformation sensor at each of the first and second frequency components of the excitation signal; and the frequencies of the first and second frequency components of the excitation signal.

The capacitance solution module may be operable to determine individual capacitances of the first capacitive sensor and the second capacitive sensor.

The capacitance solution module may be operable to determine individual capacitances of the first capacitive sensor and the second capacitive sensor individually.

A vector function may equate reactance dependent on current and voltage to a model of reactance for the deformation sensor a frequency component of the excitation signal.

The model may have terms representing the first and second sensor resistors and capacitances for the first and second capacitive resistors.

The model may neglect a resistance of electrodes forming a capacitance of the first and/or second capacitive sensor. A resistance of electrodes may be treated as zero.

The model may neglect a leakage resistance of the first and/or second capacitive sensor. A leakage resistance may be treated as infinite.

The capacitance solution module may be operable to find a numerical approximation for the capacitance of the first capacitive sensor and the second capacitive sensor dependent the set of equations, a mathematical derivative of the set of equations and a convergence error between successive iterations of a numerical approximation.

The mathematical derivative may be a Jabobian matrix for a matrix representing the vector function at first and second frequencies.

Other aspects of the invention comprise the deformation sensor of any one of the paragraphs above comprising a third sensor resistor and a third capacitive sensor.

Other aspects of the present invention comprise the reactance sensing module operable to sense the reactance of the deformation sensor at a frequency of a third frequency component.

In other aspects of the present invention the frequency components are determined by a filter to remove frequencies of a broad-spectrum excitation signal.

By selecting an analytical model of the sensor circuit which neglects leakage resistance of the capacitive sensors the capacitance solving module can treat a set of equations of analytical reactance determined for the model using known sensor resistances on one side and known reactances.

The first and second sensing resistors may be adapted such that sensing resistance may be substantially constant as the first or second capacitive sensors are deformed.

The sensor may have capacitive sensors and sensing resistors formed therein so as to provide an integrated sensor operable to sense first and second deformations of first and second capacitive sensors.

In one aspect the present invention provides a deformation sensor comprising: a first capacitive sensor operable to deform and to vary in capacitance with deformation,
  a second capacitive sensor operable to operable to deform to and to vary in capacitance with deformation, the second capacitive sensor connected in parallel with the first capacitive sensor;
  a sensing resistor having a defined resistance, being connected in series with the second capacitive sensor and being connected in parallel with the first capacitive sensor;

a set of excitation terminals connected to receive a voltage signal to excite the first capacitive sensor and the second capacitive sensor.

The resistance of the first resistor is approximately 10000 times the resistance of electrodes of the capacitive sensors.

The leakage resistance the capacitive sensors is approximately 10<9> times the electrode resistance the capacitive sensors.

The first sensing resistor is approximately 1.5 times the resistance of the of the second sensing resistance.

In another aspect the invention provides a device comprising:
  a set of N capacitive sensors operable to vary in capacitance to provide a means of sensing;
  a set of N resistors of selected resistances,
  an excitation circuit operable to excite the set of capacitive components with a set of N excitation component frequencies,
  a reactance component operable to connect to the sensing channel to determine the reactance of the capacitive sensor components and resistance components as a set to provide measured reactance, the reactance determined at each at each of the N excitation component frequencies to provide measured reactance at each,
  a calculating component operable to find a numerical solution for the capacitances of the set of N sensors dependent on:
  the reactance at each of the N frequency components,
  ii) the resistance of each of the N interstitial resistance components; and
  the frequency of each of the N component frequencies of the excitation signal.

The calculating component may be operable to find a numerical solution for the capacitances of the set of N capacitive sensors using a set of vector functions defined by the measured reactance for each component frequency and analytical reactances of the N resistor components N capacitive sensor for each component frequency.

The capacitance of the capacitive characteristic may vary in a known relation to deformation to allow the capacitive characteristic to characterise deformation.

The first sensing resistor may have a value which is selected such that a model of the sensor resistance in series with the capacitive sensor wherein the model neglects any leakage resistance in the capacitive sensor which is in parallel with a capacitance of the sensor will approximate the electrical characteristics of the sensor resistance in series with the capacitive sensor. This approximation may be within a defined tolerance or error.

The approximation may be such that any leakage resistance in parallel with the capacitance is negligible.

A device operable to instrument multiple modes of deformation of a body over an electrical sensing channel, the device comprising:
  a set of N capacitive sensor components each operable to deform to provide a capacitive characteristic for a mode of deformation, the set of capacitors connected to the sensing channel,
  a set of N sensing resistor components of selected resistance separating the capacitive sensor components,
  an excitation circuit operable to excite the set of capacitive components with a set of N excitation component frequencies,
  a reactance component operable to connect to the sensing channel to determine the reactance of the capacitive sensor components as a set, the reactance determined at each at each of the N excitation component frequencies, a calculating component operable to find a numerical solution for the capacitance of the set of N sensors dependent on the reactance at each of the N frequency components, ii) the resistance of each of the N sensing resistance components and the frequency of each of the N component frequencies of the excitation signal.

A capacitance sensor operable to measure first and second variable capacitance comprising:

a first capacitive sensor operable to vary in capacitance, a second capacitive sensor operable to vary in capacitance, the second capacitive sensor connected in parallel with the first capacitive sensor;

a first sensing resistor having a first selected resistance and connected is series with the first capacitive sensor;

a second sensing resistor having a second selected resistance being connected in series with the second capacitive sensor and connected in parallel with the first capacitive sensor;

a set of excitation terminals connected to receive a voltage signal to excite the first capacitive sensor and the second capacitive sensor;

a set of sensing terminals connected so as to provide a voltage to a sensing circuit the voltage proportional to the current between the excitation terminals.

A deformation sensor component operable to operable to connect to a capacitance measuring apparatus having a pair of terminals and a first resistor of selected resistance to allow measurement of a voltage which is proportional to current flowing in a connected component due to an excitation voltage signal, the deformation sensor component comprising:

a first capacitive sensor able to deform and operable to vary in capacitance with deformation, a second capacitive sensor able to deform and operable to vary in capacitance with deformation, the second capacitive sensor connected in parallel with the first capacitive sensor;

a second sensing resistor having a second selected resistance being connected in series with the second capacitive sensor and connected in parallel with the first capacitive sensor.

The sensor resistances may be in the order of 10000 times the electrode resistance of the capacitive sensor.

A sensor resistance may be selected dependent on a capacitance of a capacitive sensor so as to allow an excitation signal in the order of tens of kilo-Hertz to excite each of the capacitive sensors. Excite may comprise exciting so as to measure capacitance.

The deformation sensor may be formed on flexible material.

Aspects of the present invention comprise a process to determine values for electronic components in a circuit having N capacitances arranged in parallel with each other and N resistances arranged with a circuit equivalent of a resistance in series with each of the N capacitances the circuit having first and second excitation terminals arranged to receive an excitation voltage 10 signal for the N capacitances and N resistances, the process comprising the steps of:

measuring at N frequency components real and imaginary components of the impedance of the circuit; and numerically solving a set of 2N equations of a vector function provided by equating at each of the N frequency components the real component of a model for impedance of the circuit to the measured real component of impedance for the circuit and by equating the at each of the N frequency components the imaginary component of a model for impedance of the circuit to the measured imaginary component of impedance for the circuit.

Aspects of the present invention provide a sensor comprising a soft electronic circuit operable to deform and to change one or more electronic characteristics with deformation, wherein the circuit comprises two or more soft capacitors having a capacitance characteristic which changes with deformation, wherein the two or more capacitors are arranged in parallel with each other, the circuit further comprising soft conductive leads for the capacitors.

As used herein the term 'terminal' is intended to refer broadly to any point or node on a circuit where a voltage or current is sensed, received or measured and is not limited to terminals which are adapted for connection to circuits or components.

As used herein the term "measure", or similar, refers broadly to any known means for determining a parameter value and includes but is not limited to finding an approximation for a parameter value.

As used herein the term "sensing", or similar refers broadly to any known means for knowing a parameter value or knowing that a parameter value has changed and includes but is not limited to finding an approximation for a parameter value.

In the preceding description and the following claims the word "comprise" or equivalent variations thereof is used in an inclusive sense to specify the presence of the stated feature or features. This term does not preclude the presence or addition of further features in various embodiments.

As used herein a 'vector function' is intended to refer broadly to a function operating on vectors.

BRIEF DESCRIPTION OF THE DRAWINGS

Additional and further aspects of the present invention will be apparent to the reader from the following description of embodiments, given in by way of example only, with reference to the accompanying drawings in which:

FIG. 4a shows a phase diagram with a sensor voltage VRN and excitation voltage VRN of a deformation sensor according to the same embodiment of the present invention;

FIG. 4b shows a phase diagram depicting the impedance of a deformation sensor according to the same embodiment of the present invention;

FIG. 5 depicts a deformation sensor apparatus according to another embodiment of the invention;

Further aspects of the invention will become apparent from the following description of the invention which is given by way of example only of particular embodiments.

BEST MODES FOR CARRYING OUT THE INVENTION

Figure 1:
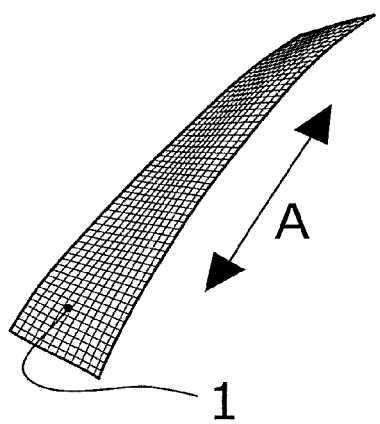
FIG. 1 shows a capacitive stretch sensor in accordance with an embodiment of the present invention.

FIG. 1 shows a capacitive sensor 1. The capacitive sensor of this example is elongate and stretched predominantly in direction A. The capacitive sensor 1 has a capacitance which changes with the geometry of the sensor as it is deformed, by stretch or compression for example. Measuring the capacitance of the sensor 1 allows deformation to be measured and instrumented. In this example the capacitive sensor 1 is a fabric sensor and the deformation to be instrumented is stretch in a material onto which the capacitive sensor is affixed.

Figure 2:
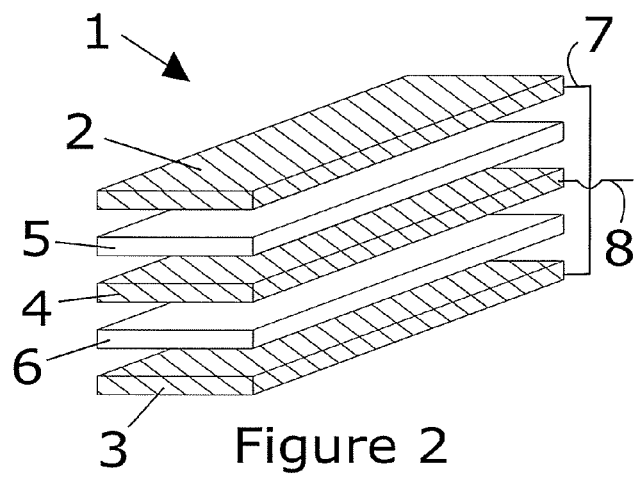
FIG. 2 shows gives an exploded view of a capacitive stretch sensor in accordance with the same embodiment of the present invention as FIG. 1.

FIG. 2 shows an exploded view of the fabric capacitive sensor 1. The sensor has outer electrodes 2 and 3 and an inner electrode 4 formed of a conductive fabric. In this example the conductive fabric of the electrodes 2, 3 and 4 have a resistance in the order of Ohms. As shown, the inner electrode 4 separated from the outer electrodes 2 and 3 by dielectric layers, or dielectrics, 5 and 6. The outer electrodes 2 and 3 are connected in common to an outer electrode terminal 7 and the inner electrode is connected to an inner electrode terminal 8. The dielectrics and 6 separate the outer electrodes 2 and 3 from the inner electrode 4 to provide a capacitance measurable across terminals 7 and 8. As the reader will appreciate a change in geometry of the capacitive sensor 1 will change the geometry of the electrodes 2, 3 and 4 and will change the capacitance. For example, the overlapping area of the outer electrodes 2 and 3 with respect to the inner electrode 4 may change resulting in a changed capacitance. Also for example if the separation of the outer electrodes 2 and 3 from the inner electrode 4 is changed the capacitance will change also. As the reader will appreciate various types of measurements may be made by measuring capacitance of the capacitive sensor 1. To name one example, a capacitive sensor 1 may have a calibrated capacitive characteristic which allows a length or degree of stretch or other deformed state of the capacitive sensor 1 to be measured by measuring capacitance of the sensor. Also for example, capacitance may be measured at different times to calculate a change in capacitance to sense the occurrence of deformation or degree of stretch.

The capacitance of a capacitive sensor, such as shown in FIG. 1 and FIG. 2 can be expressed as:

$$C = 2 \cdot \frac{\varepsilon_0 \cdot \varepsilon_r \cdot A}{t},\qquad\text{Equation 1}$$

where C is the capacitance, A is the electrode area and t is the thickness of the dielectric material which separates the electrodes, ε0 is the permittivity of a vacuum, and εr is the relative permittivity of the dielectric material.

Figure 3:
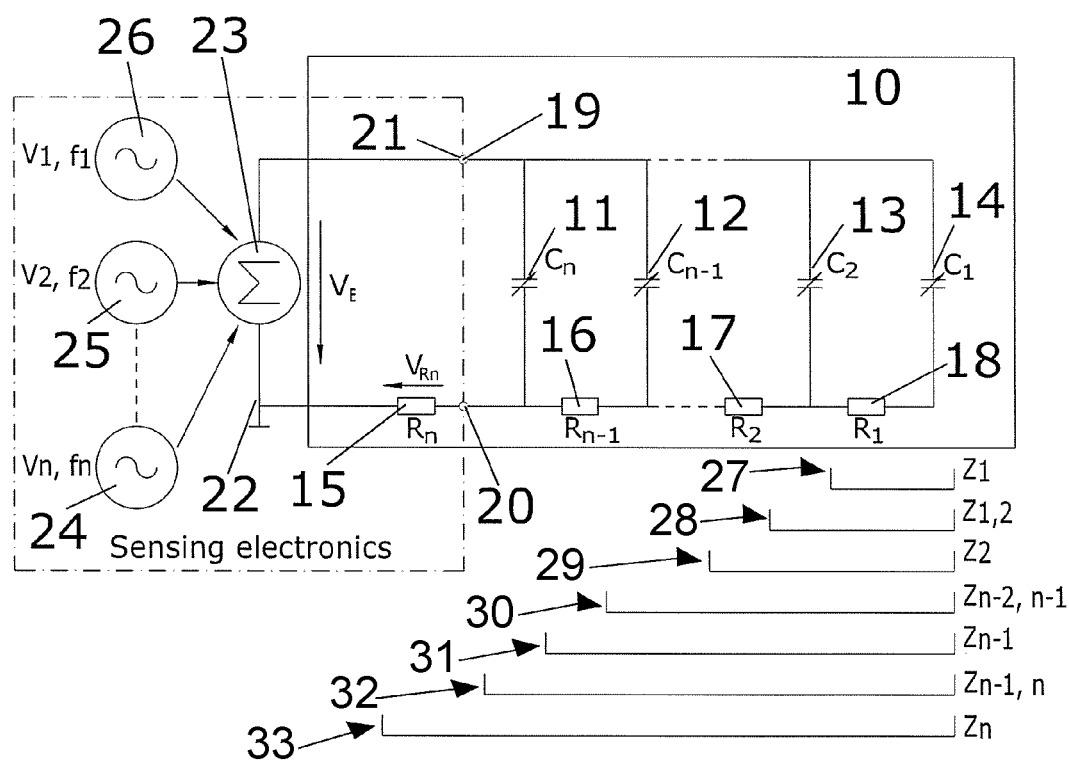
FIG. 3 depicts a deformation sensing apparatus according to the same embodiment of the present invention.

FIG. 3 depicts a deformation sensor circuit 10 according to a preferred embodiment of the present invention. The deformation sensor circuit 10 is used to measure deformation with N capacitive sensors depicted as variable capacitors CN to C1. FIG. 3 shows a first variable capacitor 11, a second variable capacitor 12, a third variable capacitor 13 and a forth variable capacitor 14. The deformation sensor 10 also has N sensing resistances depicted as fixed resistors 15, 16, 17 and 18. The sensing resistors have selected resistances. In this embodiment the sensing resistors 15 to 18 are off-the-shelf metal film resistors. Pairs of variable capacitors, as capacitors, and sensing resistors will act as filters for similar pairs further from the excitation terminals 19 and 20.

The reader will be aware that the circuit 10 as depicted is an approximation of a circuit having N capacitive sensors. In this particular approximation electrode resistances have been neglected as smaller than series resistances and resistance between electrodes of the same capacitive sensor have been approximated as infinite.

FIG. 3 shows excitation terminals 19 and 20 which receive in use an excitation signal 21. The excitation terminal 19 is depicted as connected to a terminal (not shown) of the first variable capacitor 11. The excitation terminal 20 is connected to a terminal (not shown) of the first depicted sensor resistor 15 on the opposite end of the resistor to the first variable capacitor.

FIG. 3 also shows sensing terminal 21 which is connected to the first depicted variable capacitor at a point where the excitation signal is received. In this example, the sensing terminal 21 is common with the excitation terminal 19. Another sensing terminal 22 is connected between the first depicted sensing resistor 15 and the first depicted sensing capacitor 11. The sensing terminals 21 and 22 are connected across the first depicted resistor and therefore able to receive a voltage across the first sensing resistor. This sensing voltage VRN is proportional to the current received from the excitation terminals 19 and 20 and passing through the circuit of the deformation sensor.

FIG. 3 also shows an excitation module 23 connected to the deformation sensor 10 to supply an excitation voltage signal to the excitation terminals 19 and 20 of the deformation sensor 10 to excite the variable capacitors to allow their capacitance to be measured. In this embodiment the excitation voltage signal is a low voltage, in the range of 1 to 10 volts for example. FIG. 3 also shows N signal generators, depicted as 24, 25 and 26, providing N frequency components depicted as f1 to fN to the excitation signal module 23. In this example the N signal frequency components are sinusoidal signals at selected frequencies.

The first depicted sensing resistor RN 15 is connected in series with the first variable capacitor CN 11. As discussed above the first variable capacitor CN represents a capacitive sensor which provides a variable capacitance which can be measured to sense or instrument deformation of the sensor.

The second depicted sensing resistor 16 is arranged or connected in series with the second depicted variable capacitor 12 and resistor 16 and capacitor 12 are connected in parallel with the first variable capacitor 11.

The third depicted sensing resistor 17 is connected in series with the third depicted variable capacitor 13 and resistor 17 and capacitor 13 are in parallel with the second depicted variable capacitor 12.

In the example shown in FIG. 3 the CN are in the range of a 100 pico-Farads. An excitation signal in the region of 10 volts will allow the leakage current to be neglected.

Also in the example shown in FIG. 3, the resistance RN is selected at 33 kOhms and the remaining resistances are selected 22 kOhms. In the example of FIG. 3, the capacitive sensor electrode resistance is in the region of a few ohms and the leakage resistance across dielectric of a capacitive sensor are in the region of 10<6> or 10<9> Ohms. Therefor the electrode leakage currents of the capacitive sensors may be treated as negligible in an analytical expression or model for reactance of the circuit 10.

Given capacitances 11 to 14 in the range of a few hundred pico-Farads, sensor resistors 15 to 18 selected to be in the 10 kOhm range will allow sensing frequencies in the range of tens of kHz. In this example, the sensor resistances 15 to 18 are in the same order of magnitude as each other.

RN 15 needs to be large enough to produce a voltage drop VRN in the same order of magnitude as VE.

Resistors in the current embodiment are be selected to be known and need to be constant to be known also.

The operation of the deformation sensor 10 will now be described with reference to FIG. 3. An excitation signal having N signal frequency components is received from an excitation module 23 at excitation terminals 19 and 20. An alternating current excitation voltage signal having N frequency components propagates charge through the deformation sensor circuit 10. The amplitude of the excitation signal at given variable capacitors will vary over the N different frequency components due to variable capacitors closer to the excitation terminals 19 and 20, along with respective sensing resistance in series with the variable capacitors, acting as filters.

This effect may be understood by considering the deformation sensor circuit, having a set of parallel capacitors each with a series resistor, as a transmission line. The sensing frequency bandwidth of the deformation sensor circuit 10 is determined by the capacitance of the capacitive sensors 11 to 14 and the sensor resistances 15 to 18. This allows the resistor values to be utilised as design parameters to shift frequencies of excitation signal that would allow charging of all capacitors in the circuit 10, or sensing frequencies, to into practical orders of magnitude. In this embodiment these frequencies are in the range of tens of kHz.

A voltage signal sensed at the sensing terminals 21 and 22 is the voltage drop across the sensing resistor 15 and is proportional to a charge current through the deformation sensor circuit 10.

The current through the deformation sensor along with the voltage at the excitation terminals 19 and 20 allows the impedance of the deformation sensor 10 to be sensed or measured. Specifically, it is possible to measure the impedance at each frequency component. From the impedance and selected, thereby known, resistance RN the reactance of the deformation signal at each frequency component can be measured.

FIG. 3 also depicts a set of impedances determined analytically for sub-circuits 27 to 33 of the whole deformation sensor circuit 10. The low voltage of the excitation voltage signal allows an analytical model to neglect a leakage resistance which would be in parallel with each variable capacitor 11 to 14. Also, the capacitive sensors selected for this embodiment have electrodes with a low resistance compared to the sensor resistances 15 to 18 and can be neglected in an analytical model.

The impedances of an analytical model depicted in FIG. 3 are as follows: The impedance of the circuit 27 can be represented analytically as:

$$Z_1 = R_1 + \frac{1}{i\omega \cdot C_1} \quad \text{Equation 2}$$

where R1 is the resistance of the sensing resistor 18 in series with the variable capacitor 14 which has capacitance C1 and ω is the angular frequency of the excitation signal.

The impedance of the circuit 28 can be represented analytically as Z1,2:

$$Z_{1,2} = \frac{1}{i\omega C_2 + \frac{1}{Z_1}} \quad \text{Equation 3}$$

Where C2 is the capacitance of the variable capacitor 13.

The impedance of the circuit 29 can be represented analytically as Z2

$$Z_2 + R_2 + Z_{1,2}, \quad \text{Equation 4}$$

where R2 is the resistance of the sensing resistor 17.

The impedance of the circuit 30 can be represented analytically as Z2,3:

$$Z_{2,3} = \frac{1}{i\omega C_3 + \frac{1}{Z_2}}, \quad \text{Equation 5}$$

where C3 is the capacitance of the variable capacitor 12.

$$Z_{n-1} = R_{n-1} + Z_{n-2,n-1} \quad \text{Equation 6}$$

By the same approach the impedance of the circuit 32 can be represented analytically as Zn−1,n:

$$Z_{n-1,n} = \frac{1}{i\omega C_n + \frac{1}{Z_{n-1}}}, \quad \text{Equation 7}$$

where Cn is the capacitance of the first variable capacitor 11.

Also by the same approach the impedance of the circuit 33, the whole deformation sensor circuit 10, can be represented analytically as Zn:

$$Z_n = R_n + Z_{n-1,n} \quad \text{Equation 8}$$

The reactance of the sensor circuit 10 is the imaginary term of the impedance equation.

$$Xn = Im(Z) \quad \text{Equation 9}$$

The deformation sensor with excitation signals and sensing signals represents a system in which N sensing resistances are known, N excitation signal frequency components are known, N impedances at the frequency components are known so it is possible to measure the N capacitances. In this sense N capacitances can be measured if N known series resistances are included in the circuit for each of the N capacitances, an excitation signal with N known frequency components is applied to the circuit 10, and the reactance of the circuit at each of the N known frequencies is measured. By the analytical treatment above the reactance, or the impedance, of the deformation circuit 10 can be represented by N equations also. Therefore, the present embodiment of the invention can be represented as N equations with N known parameters which can theoretically be solved to find the capacitances of the N variable capacitors. Therefore also, the present embodiment allows measurement of each capacitive sensor when the sensors are deformed simultaneously, or any other combination such as when only one capacitive sensor is deformed. This is whether or not the capacitive sensors are mechanically coupled or decoupled, aligned or orthogonal to name some examples.

FIGS. 4a and 4b illustrate how the reactance Xn of the deformation sensor circuit can be measured from the excitation voltage signal applied to the deformation sensor circuit 10 and the sensing voltage signal across the first sensing resistor RN which is proportional to the charging current through the deformation sensor circuit.

FIGS. 4a and 4b illustrate how reactance, of the deformation sensor can be measured in accordance with this embodiment of the present invention.

Measurements of reactance provides equations of analytical reactance and measured reactance which are dependent on known sensing resistances and know frequencies of excitation signal to calculate, or measure, the capacitances of the variable capacitors 11 to 14.

The reactance of the deformation sensor circuit 10 is measured dependent on the excitation voltage signal applied to the excitation terminals 19 and 20 and on the sensing voltage signal available at the sensing terminals 21 and 22. By placement of the sensing terminals across an excitation terminal 19 and the first sensing resistor 14, the sensing voltage signal VRN is proportional to the current through RN, the first sensing resistor 14. As the first sensing resistor 14 is in series with the rest of the deformation sensor circuit 10 the sensing voltage VRN is proportional to the current through the deformation sensor circuit 10. This is, VRN is equal to the product of the current through the circuit and the resistance RN of sensing resistor 14.

FIG. 4a shows a phase diagram with the sensor voltage VRN represented by a phasor 34 and the excitation voltage VE represented by the phasor 35. A phase delay is represented by the angle Phi 36. Also shown is a phasor 36 representing the current through the deformation sensor circuit 10 which is phase with VRN 34.

FIG. 4b shows a phase diagram depicting the impedance ZN with phasor 37, which is complex, with real impedance 38 and imaginary impedance 39. As depicted the projection of the complex impedance on to real impedance 38 and imaginary impedance 39 is determined by the phase angle, or phase delay 36 which can be found from the sensing voltage VRN and the excitation voltage VE.

In practice the determination of the phasors is a data operation using data in data structures or variables which carry the information of phasors, or equivalent information known to the reader, for the excitation voltage and sensing voltage. The impedance of the sensor circuit can also be represented analytically.

The impedance of the deformation circuit 10 is Z:

$$Z = R + iX,\qquad\text{Equation 10}$$

where R is resistance and X is reactance.

The magnitude of the impedance is |Z|:

$$|Z| = \frac{V_E}{I},\qquad\text{Equation 11}$$

where VE is the excitation voltage signal for a given frequency component and I is the current through the deformation sensor circuit.

The current through the deformation sensor circuit 10 is:

$$I = \frac{V_{Rn}}{R_n},\qquad\text{Equation 12}$$

where VRn is the sensing voltage signal, or voltage across the terminals 21 and 22 or the voltage across the sensing resistor 15.

The reactance of the deformation signal X is:

$$X = |Z|\cdot\sin(\phi),\qquad\text{Equation 13}$$

where |Z| is provided by Equation 11 and ϕ is and the phase angle between the VRN and VE.

With analytical expressions for reactance of sub-circuits of the deformation circuit 10 in Equations 2 to 9 and measured reactance of the deformation circuit 10, a set of equations can be written to solve for the individual capacitances of the variable capacitors of the circuit 10, representing capacitive sensors.

In equations 13, 14 and 15 below, the left-hand side represents the measured reactances and the right-hand side is provided by the analytical expression for reactances.

$$X_{n,\omega 1} = \text{Im}[\underline{Z}(\omega_1, C_1 \ldots C_n, R_1 \ldots R_n)]\quad\text{Equation 13}$$
$$X_{n,\omega 2} = \text{Im}[\underline{Z}(\omega_2, C_1 \ldots C_n, R_1 \ldots R_n)]\quad\text{Equation 14}$$
$$\vdots$$
$$X_{n,\omega n} = \text{Im}[\underline{Z}(\omega_{1n}, C_1 \ldots C_n, R_1 \ldots R_n)]\quad\text{Equation 15}$$

where ωn is the angular frequency of the nth signal component of the excitation signal.

In this embodiment the set of equations exemplified by 13, 14 and 15 are solved numerically. In this embodiment the Newton Raphson method is used to find solutions. The solutions are found in this embodiment in real time.

The Newton Raphson method for numerically solving the equations is used in this embodiment to iteratively calculate the vector {right arrow over (C)} of capacitances in the vector function:

$$\vec{C} = \begin{pmatrix} C_1 \\ C_2 \\ \vdots \\ C_n \end{pmatrix},\qquad\text{Equation 16}$$

where Cn is the first variable capacitance 11 in the deformation circuit 10.

One step of the Newton Raphson method is described by:

$$\vec{C}_{k+1} = \vec{C}_k - [f'(\vec{C}_k)]^{-1} f(\vec{C}_k),\qquad\text{Equation 17}$$

where k+1 designates the current iteration, k designates the previous iteration, f($\vec{C}_k$) is a vector function derived from the set of equations exemplified by equations 13 to 15, and $J(\vec{C}_k)$ is a Jacobian matrix.

In this embodiment a vector function can be calculated by transposing the set of equations exemplified by equations 13 to 15 and expressing in vector form.

$$f(\vec{C}_k) = \begin{pmatrix} f_1 \\ f_2 \\ \vdots \\ f_n \end{pmatrix} = \begin{pmatrix} \partial [Z_n(\omega_1, C_1 \ldots C_n, R_1 \ldots R_n)] - X_{\omega 1} \\ \partial [Z_n(\omega_2, C_1 \ldots C_n, R_1 \ldots R_n)] - X_{\omega 2} \\ \vdots \\ \partial [Z_n(\omega_n, C_1 \ldots C_n, R_1 \ldots R_n)] - X_{\omega n} \end{pmatrix} \quad \text{Equation 18}$$

The Jacobian matrix of first order derivatives of $f(\vec{C}_k)$ is:

$$J(\vec{C}) = \frac{\partial f_i}{\partial C_j} = \begin{bmatrix} \frac{\partial f_1}{\partial C_1} & \frac{\partial f_1}{\partial C_2} & \cdots & \frac{\partial f_1}{\partial C_n} \\ \frac{\partial f_2}{\partial C_1} & \frac{\partial f_2}{\partial C_2} & \cdots & \frac{\partial f_2}{\partial C_n} \\ \vdots & \vdots & \ddots & \vdots \\ \frac{\partial f_n}{\partial C_1} & \frac{\partial f_n}{\partial C_2} & \cdots & \frac{\partial f_n}{\partial C_n} \end{bmatrix} \quad \text{Equation 19}$$

When implemented on a computer, or other processor, according to the present embodiment, the calculation of the inverse of the Jacobian matrix is a processing costly operation. The present embodiment takes an alternative approach by introducing the difference between two iterations. This difference is:

$$\Delta \vec{C}_k = \vec{C}_{k-1} - \vec{C}_k \quad \text{Equation 20}$$

With this definition Equation 18 can be expressed as:

$$\Delta \vec{C}_k = -[J(\vec{C}_k)]^{-1} \cdot f(\vec{C}_k) \quad \text{Equation 21}$$

The present embodiment transposes Equation 21 to express a system of linear equations and solves these for $\Delta \vec{C}_k$:

$$J(\vec{C}_k) \cdot \Delta \vec{C}_k = -f(\vec{C}_k) \Rightarrow \Delta \vec{C}_k \quad \text{Equation 22}$$

A capacitance vector is in a current iteration is calculated according to the present embodiment by adding the difference $\Delta \vec{C}_k$ to a vector found in the previous iteration.

This means that the change between two iterations is small enough for the result to be sufficiently close to the true capacitance value. This is, a numerical solution was found.

A capacitance vector is in a current iteration is calculated according to the present embodiment by adding the difference $\Delta \vec{C}_k$ to a vector found in the previous iteration.

The iterative process continues, according to the present invention, until the absolute value of A is lower than a defined tolerance:

$$\vec{C}_{k+1} = \vec{C}_k + \Delta \vec{C}_k \quad \text{Equation 23}$$

A capacitance vector in a current iteration is calculated according to the present embodiment by adding the difference $\Delta C_k$ to a vector found in the previous iteration.

This means that the change between two iterations is small enough for the result to be sufficiently close to the true capacitance value. This is, a numerical solution has been found.

A capacitance vector is in a current iteration is calculated according to the present embodiment by adding the difference to a vector $\Delta C_k$ found in the previous iteration.

The iterative process continues, according to the present invention, until the absolute value of $\Delta \vec{C}_k$ is lower than a defined tolerance:

$$\vec{C}_{k+1} = \vec{C}_k + \Delta \vec{C}_k \quad \text{Equation 24}$$

FIG. 5 depicts a deformation sensor apparatus 39 according to another embodiment of the invention. The apparatus 39 provides measurement of variable capacitances of multiple capacitive sensors of a deformation sensor 40, which has N capacitive sensors of unknown variable capacitance, depicted by capacitances 41 to 44, and N sensor resistors of selected and known resistance R1 to RN depicted by 45 to 48. The apparatus 39 has N waveform generator modules, depicted as 49 to 51 which provide N frequency components for an excitation signal module 52.

A Fast Fourier Transform module 53 receives an excitation signal applied to the deformation sensor 40 and a sensing signal taken at the sensor 40 as the voltage across the resistor 45. The Fast Fourier Transform module 53 outputs a data signal for the amplitude and phase of the excitation signal voltage. The Fast Fourier Transform module 53 also outputs a data signal for the amplitude and phase of the current through the deformation sensor, which is proportional and in phase with the sensing voltage signal. A reactance calculation module 54 receives the data signals from the Fast Fourier Transform module 53 and calculates the reactance dependent on the amplitude and phase of the excitation voltage signal and also the amplitude and phase of the current. The reader may recognise the Fast Fourier Transform module 53 and the reactance calculation module 54 acting collectively to measure the reactance of the deformation sensor dependent on the excitation signal, which provides voltage to the deformation sensor 40, and dependent on the sensing signal, which is the voltage across the first sensing resistor 45 and which is proportional to the current through the deformation sensor 40.

A model module 55 reads data carrying information on a set of stored equations, or vectors, representing an analytical reactance of the deformation sensor 40.

A parameter module 56 reads stored values for sensor resistances, angular frequencies of the excitation signal components and calibration, or initial state, capacitances C1,0 to Cn,0.

A numerical solution module 57 calculates numerical solutions for the capacitances C1 to Cn of the deformation sensor.

The apparatus illustrated has modules illustrated as functional blocks described in reference to the function they perform.

Figure 6:
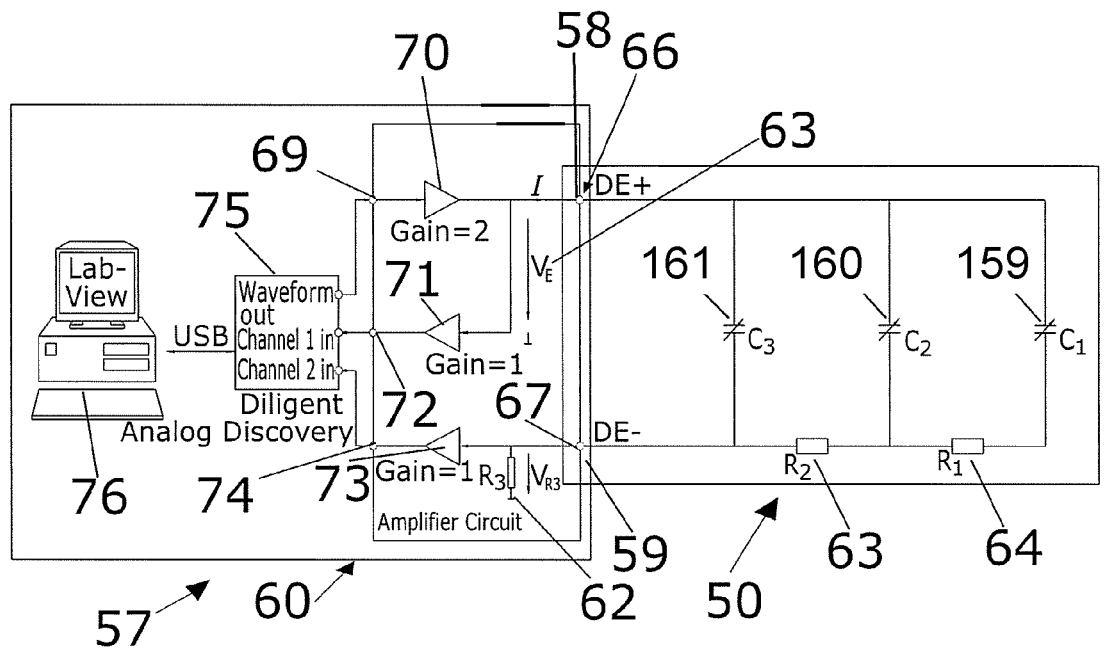
FIG. 6 illustrates a deformation sensing apparatus according to a further embodiment of the present invention.

FIG. 6 illustrates a deformation sensing apparatus 57 according to a further embodiment of the present invention. The apparatus has a deformation sensor 50 with three capacitive sensors depicted as first variable capacitor 159, second variable capacitor 160 and third variable capacitor 161. The variable capacitors have an initial capacitance value but change in capacitance with deformation. The apparatus is operable to measure the capacitance of each variable capacitor. In this embodiment the variable capacitances are provided by a fabric capacitive sensor which changes capacitance as it is deformed through a change in its geometry, such as by stretching for example.

The apparatus 57 has three sensing resistors which space or separate the sensing capacitances 159, 160 and 161. A first sensing resistor 62 is in series with the first variable capacitance 159. A second sensing resistor 63 is in series with the second variable capacitance 160. A third sensing resistance 64 is in series with the third variable capacitor 161. Each sensing resistance, such as 63 is in series with a respective variable capacitor, such as 161, and the capacitor 61 and its series resistance 64 is in parallel with the other capacitors, such as 160 and 159.

In this embodiment the first sensing resistor is included in a measuring apparatus 60 which connects to the deformation sensor 50 to make up the deformation sensing apparatus 57. In this embodiment the measuring apparatus measures capacitance. The deformation sensor 50 and the capacitance measuring apparatus 57 are connected at a single set of terminals 58 and 59. This allows the capacitance of three variable capacitances to be measured over a single pair of terminals. As the variable capacitances of these capacitive sensors change with deformation, such as stretching, the deformation sensing apparatus 57 of this embodiment allows sensing of deformation of three capacitive sensors over a single pair of terminals 66 and 67. This may be recognized as being over a single physical channel provided by the pair of terminals 66 and 67. A field of deformation may be measured or redundant deformation measurements may be made by multiple sensors depending on whether the capacitive sensors are aligned to be mechanically coupled to a degree or aligned to be mechanically uncoupled.

The present embodiment allows sensing of deformation by three capacitive sensors in a device which requires only a pair of terminals providing a single physical channel. The reader will appreciate that other embodiments may have an any given number, N, capacitive sensors.

The capacitance measuring apparatus 60 has an amplifier circuit which connects to terminals 66 and 67 at the deformation sensor 58. The terminals 66 and 67 are in parallel with each of the variable capacitors 159, 160 and 161. The capacitance measuring apparatus 60 also has in input terminal 69 to receive a waveform, referenced to earth, to be amplified by excitation amplifier 70 and supplied to the deformation sensor 58 as an excitation voltage signal VE, referenced to earth, to generate a current in the deformation sensor 50 by the terminals 66 and 67. In this embodiment the gain of the excitation amplifier 70 is two.

An excitation reference amplifier 71 is connected to the output of the excitation amplifier to provide a buffered reference at output terminal 72 of the excitation voltage signal.

A sensing signal amplifier 73 is connected in parallel with the first sensing resistor 62 to provide a buffered sensing signal to an output terminal 74.

The amplifier circuit 64 is connected at terminals 69, 72 and 74 to a Digilient™ Analog Discovery module 75, which is connected by a computer 76 which performs processes described herein implemented in LabView™, in this particular embodiment, to measure the capacitances of the variable capacitors 159, 160 and 161.

Figure 7:
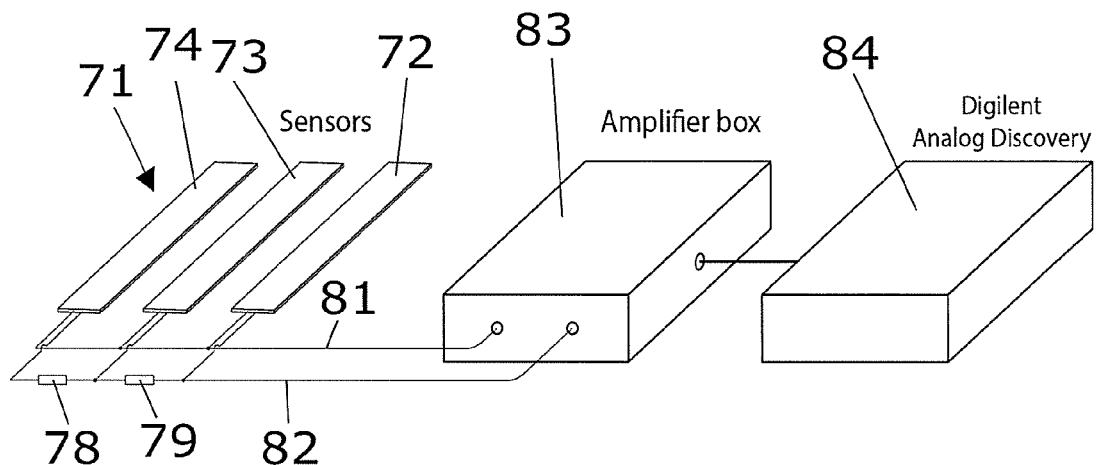
FIG. 7 depicts a deformation sensor component according to another embodiment of the present invention.

FIG. 7 depicts a deformation sensor component with three capacitive stretch sensors 72, 73 and 74 connected by two terminals to an amplifier module 75 which has the amplifier circuit 64, including the resistor 62. The excitation terminals 81 and 82 represent a two-wire connection for multiple capacitive sensors. The excitation terminals 81 and 82 also represent a de-multiplexed channel for multiple capacitive sensors. The excitation terminals also represent a single channel connection for multiple capacitive sensors. The sensors are separated by spacer resistors 78 and 79, of selected constant resistance, which perform an equivalent function to the sensing resistor 63 and resistor 64 of FIG. 6. The amplifier module 83 contains a resistor (not shown) which performs the same function of the first sensing resistor 62. Including the resistor 62 in the amplifier module 75 allows the set of capacitive sensors 72, 73 and 74 with resistors 78 and 79, to be connected to measuring apparatus by only two terminals providing a single sensing channel. A sensing device 84 is shown connected to the amplifier box 82. The reader may recognize the sensor component as a capacitive sensor array.

A further embodiment will now be illustrated with respect to FIGS. 8 to 11. In this embodiment selected and fixed resistors are replaced with soft conductive tracks or leads. In this example the tracks are made from conductive particles suspended in an elastomer matrix. As the reader will appreciate stretch or other deformation in soft conductive tracks will vary the resistance of the leads so the resistance in series with each respective capacitance is not known. Because of the variable resistance of these tracks, any model of the circuit cannot assume that resistances are known.

Figure 8:
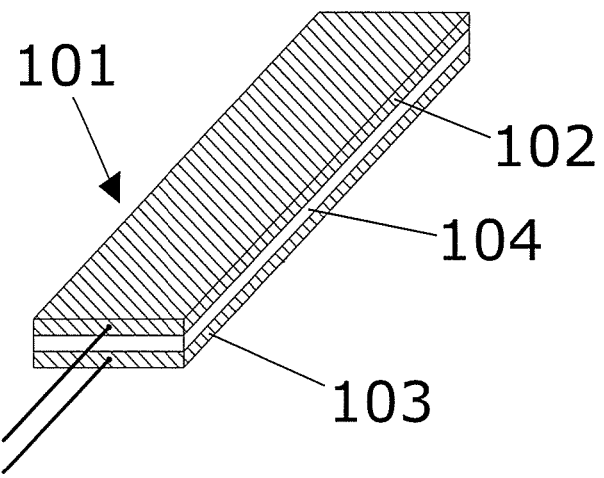
FIG. 8 shows a capacitive sensor according to a further embodiment of the present invention.

FIG. 8 shows a soft electronic component 101 in the form of a capacitor. The capacitor has electrodes 102 and 103 separated by a dielectric 104. The electrodes 102 and 103 on this example are formed of a conductive fabric.

When the sensor is deformed, its area A increases and the thickness t of the dielectric decreases. This causes the sensor capacitance to increase according to the equation below. εr is the relative permittivity of the dielectric, and 60 is the permittivity of vacuum.

c)

$$C = \frac{\varepsilon_0 \cdot \varepsilon_r \cdot A}{t} \qquad \text{Equation 25}$$

Figure 9:
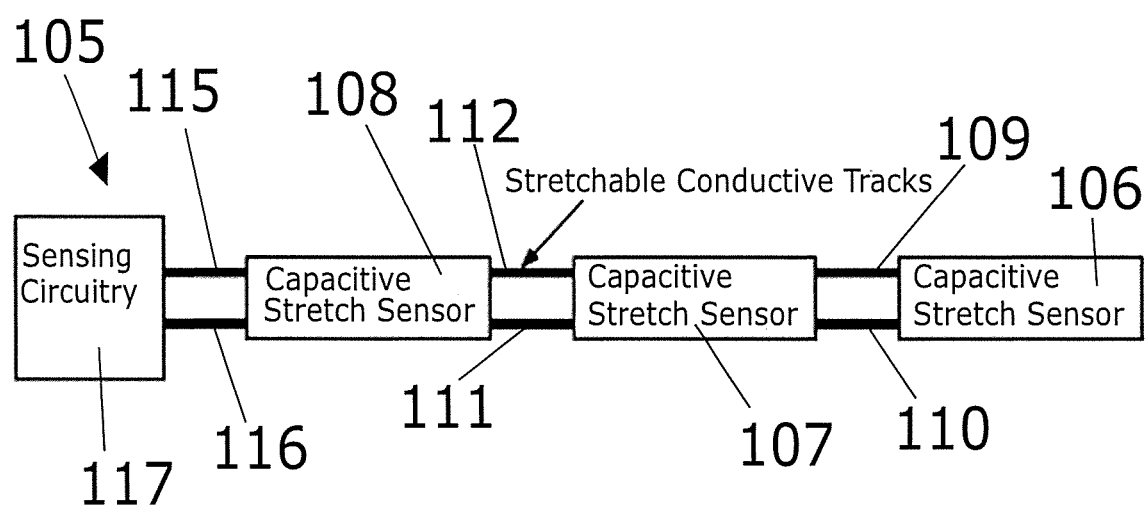
FIG. 9 shows a soft electronic sensor circuit according to the same embodiment of the present invention as FIG. 8.

FIG. 9 shows a soft electronic circuit 105 with N, in this example three, variable capacitors 106, 107 and 108. In this example the capacitor is deformable and provides an electronic characteristic, a capacitance in this example, which varies with deformation. In this example the capacitors 106-108 are adapted to be stretched to allow a degree of extension or stretch to be sensed. The capacitors of this example may be referred to as capacitive stretch sensors.

The first capacitor 106 is connected in parallel to the second capacitor 107 by two leads 109 and 110. Similarly, the second capacitor 107 is connected in parallel to the capacitor 108 by two leads 111 and 112. The two leads 115 and 116 connect the capacitor 108 to a sensing apparatus 117.

In this example the sensing apparatus determines values of capacitance for each of the capacitors and determines a value or resistance which is an equivalent resistance in series with each capacitor, such as a resistance in series with capacitor 106. Graphically this may be illustrated as a series resistance for the capacitance, in place of a bottom lead with a zero-resistance top lead, that is an equivalent resistance top and bottom leads. This equivalent resistance for the pair of leads, such as 109 and 110, may be referred to as a series lead resistance.

As shown in FIG. 9 there are two conductive elastomer leads such as 109 and 110, each with a resistance, leading to each capacitor such as 106. Mathematically, however, they can be added to a single resistance such as 135.

Figure 10:
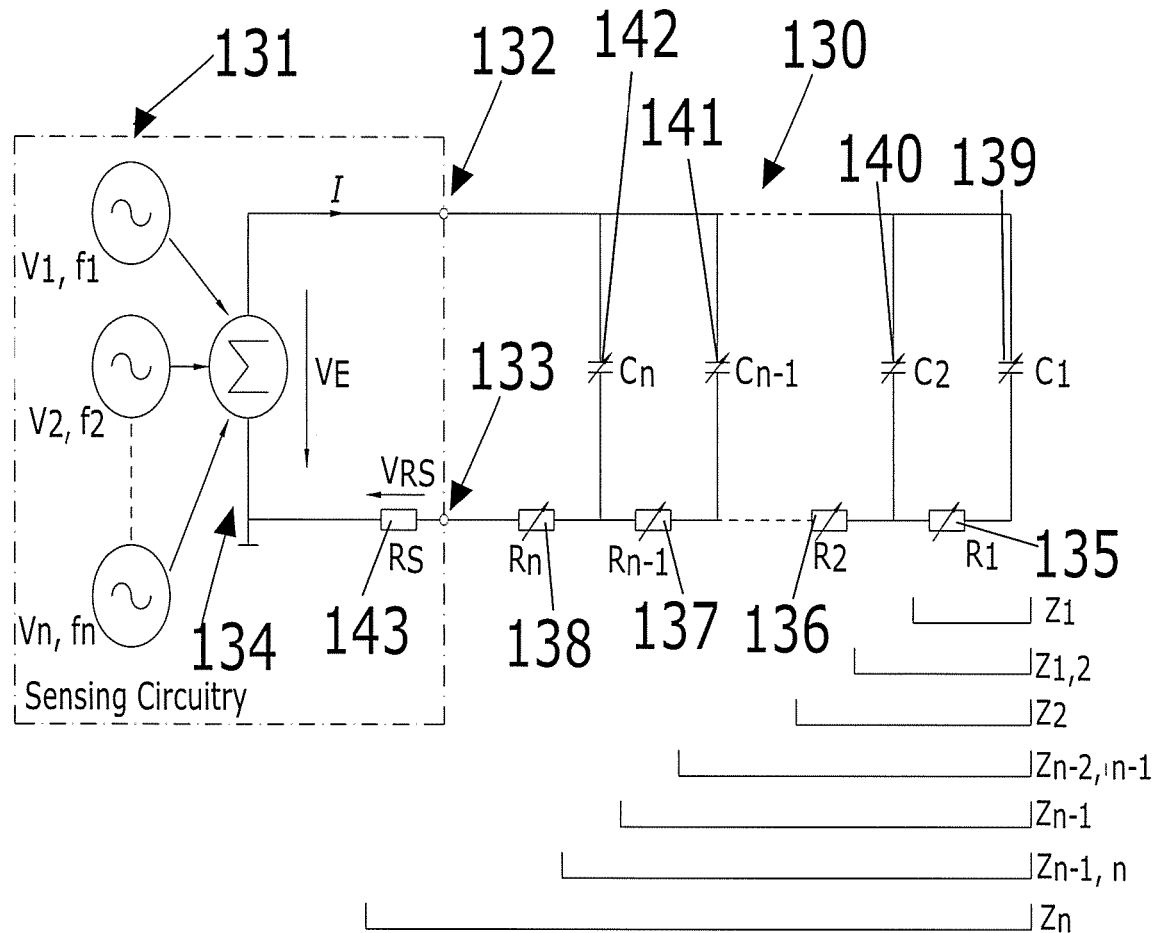
FIG. 10 shows a sensor circuit and excitation module according to a further embodiment of the present invention.

FIG. 10 shows a soft electronic circuit 130 similar to the embodiment of FIG. 9 but with an arbitrary number N of capacitors and series resistances as equivalents to pairs of leads such as 109 and 110. The soft electronic circuit is connected to a sensing an impedance module 131 of a sensing apparatus (not shown) by two terminals 132 and 133 and two sensing terminals 132 and 134. Also shown are series equivalents to resistances of the leads, such as 109 and 110. These series equivalent resistances are referred to as series leads resistances 135 to 138. The circuit 130 shown also has an arbitrary number N of variable capacitors 139 to 142. A shunt resistance 143 is included in the impedance measuring module 131 to provide a voltage signal that is proportional to the current through the circuit 130.

Figure 11:
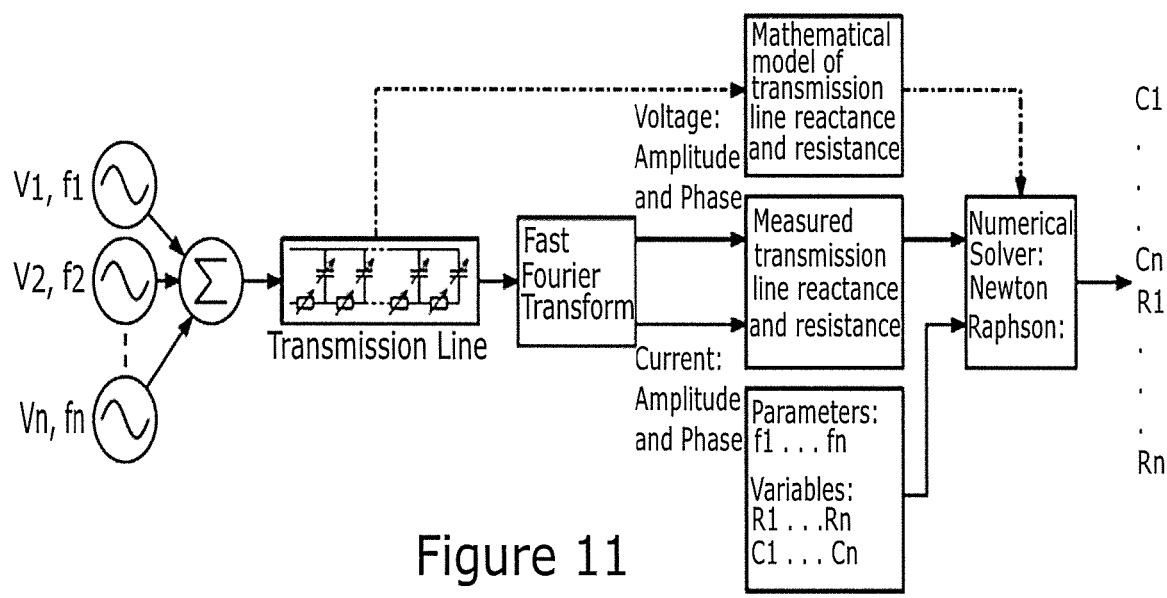
FIG. 11 shows a sensing apparatus according to the same embodiment as FIG. 10.

FIG. 11 shows sensing apparatus for sensing for a soft electronic circuit which is similar to the apparatus 40 illustrated with respect to FIG. 5. However in the case of the apparatus of FIG. 11 frequency is the only parameter and resistance is a variable. Similarly the process outputs N capacitances and N resistances.

H The sensing apparatus of FIG. 11 determines values for the unknown variables of resistances R1 to Rn, and capacitances C1 to Cn. RS, the shunt resistor for current measurement, is the only known resistance. The assumptions are identical to those in the system with constant resistances.

The following equations illustrate a process for sensing electronic characteristics, such as resistances capacitances in a soft electronic circuit or specifically a deformation sensor, according to the embodiment of the present invention of FIG. 11. The process illustrates how N unknown resistances and N unknown capacitances of a circuit 130 can be determined from real and imaginary components of measured impedance at multiple frequency components of an excitation voltage and equated with real and imaginary components of an analytical model of impedances of the circuit at the same frequencies. The process includes establishes a set of 2N nonlinear equations, and solves them numerically. In this embodiment the process applies the Newton Raphson method, starting with suitable initial values. The starting values of this embodiment are read from stored calibration data. In this embodiment the process is carried out on data carrying information on vectors, matrices for the parameters and expressions involved.

The impedance Z of the circuit 130 is measured at each frequency component of the excitation signal from measured amplitudes of the excitation voltage VE, the current I, and the phase shift between the two signals. The real parts Rei and imaginary parts Xi are determined by the geometrical relationship between Z, Rei, and Xi.

$$|Z_n| = \frac{V_E}{I} \quad I = \frac{V_{RS}}{R_S} \quad X_i = |Z_i| \cdot \sin\varphi \quad Re_i = |Z_i| \cdot \cos\varphi \qquad \text{Equation 26}$$

The overall impedance can also be calculated symbolically according to the following equations.

Equations 27 to 32

$$Z_1 = R_1 + \frac{1}{j2\pi f C_1} \qquad Z_{1,2} = \frac{1}{j2\pi f C_2 + \frac{1}{Z_1}}$$

$$Z_2 = R_2 + Z_{1,2} \qquad Z_{2,3} = \frac{1}{j2\pi f C_2 + \frac{1}{Z_2}}$$

$$\vdots \qquad \vdots$$

$$Z_{n-1} = R_{n-1} + Z_{n-2,n-1} \qquad Z_{n-1,n} = \frac{1}{j2\pi f C_n + \frac{1}{Z_{n-1}}}$$

Equation 33

$$Z_n = R_S + R_n + Z_{n-1,n}$$

With measured reactances and resistances on the left-hand side, and the corresponding symbolic terms on the right hand side, there are now 2n equations available to solve for the 2n variables C1 . . . Cn and R1 . . . Rn. As the reader will appreciate the reactances are the imaginary component of the impedance and the resistance is the real component of impedance. These nonlinear equations are solved numerically in this example process, using the Newton Raphson method known to the reader.

Equations 34 to 40

$$X_{n,f_2} = \text{Im}[Z_n(f_2, C_1 \ldots C_n, R_1 \ldots R_n, R_S)]$$

$$X_{n,f_1}$$

$$\vdots$$

$$\text{Im}_{n,f_n} = \text{Im}[Z_n(f_n, C_1 \ldots C_n, R_1 \ldots R_n, R_S)]$$

$$\text{Re}_{n,f_1} = \text{Re}[Z_n(f_1, C_1 \ldots C_n, R_1 \ldots R_n, R_S)]$$

$$\text{Re}_{n,f_2} = \text{Re}[Z_n(f_2, C_1 \ldots C_n, R_1 \ldots R_n, R_S)]$$

$$\vdots$$

$$\text{Re}_{n,f_n} = Z_n(f_n, C_1 \ldots C_n, R_1 \ldots R_n, R_S)$$

The vector below is a vector of parameters, and it contains all variables. The process of this embodiment, applying the Newton Raphson method, starts with stored initial values for the capacitances and resistances that are reasonably close to the actual values, and refines this stored initial guess during a series of iterations, until the current estimation differs from the previous one by less than a stored specified tolerance. The same tolerance is applied to both resistances and capacitances in this particular embodiment. Capacitances and resistances are different by many orders of magnitude, so the process applies a scaling factor to the capacitances such that they are in the same order of magnitude of the resistances.

Once the numerical solver has converged, the capacitances are scaled back by dividing them by the scaling factor.

$$\vec{P} = \begin{pmatrix} C_1 \\ C_2 \\ \vdots \\ C_n \\ R_1 \\ R_2 \\ \vdots \\ R_n \end{pmatrix} \quad \vec{P}_0 = \begin{pmatrix} s \cdot C_{1,0} \\ s \cdot C_{2,0} \\ \vdots \\ s \cdot C_{n,0} \\ R_{1,0} \\ R_{2,0} \\ \vdots \\ R_{n,0} \end{pmatrix} \qquad \text{Equation 41}$$

The equations are rearranged to a vector function as shown in Equation 42.

Equation 42

$$f(\vec{P_k}) = \begin{pmatrix} f_{1,X} \\ f_{2,X} \\ \vdots \\ f_{n,X} \\ f_{1,R} \\ f_{2,R} \\ \vdots \\ f_{n,R} \end{pmatrix} \begin{pmatrix} \text{Im}\left[Z_n\left(f_1, \frac{C_1}{s} \ldots \frac{C_n}{s}, R_1 \ldots R_n, R_S\right)\right] - X_{n,f1} \\ \text{Im}\left[Z_n\left(f_2, \frac{C_1}{s} \ldots \frac{C_n}{s}, R_1 \ldots R_n, R_S\right)\right] - X_{n,f2} \\ \vdots \\ \text{Im}\left[Z_n\left(f_n, \frac{C_1}{s} \ldots \frac{C_n}{s}, R_1 \ldots R_n, R_S\right)\right] - X_{n,fn} \\ \text{Re}\left[Z_n\left(f_1, \frac{C_1}{s} \ldots \frac{C_n}{s}, R_1 \ldots R_n, R_S\right)\right] - \text{Re}_{n,f1} \\ \text{Re}\left[Z_n\left(f_2, \frac{C_1}{s} \ldots \frac{C_n}{s}, R_1 \ldots R_n, R_S\right)\right] - \text{Re}_{n,f2} \\ \vdots \\ \text{Re}\left[Z_n\left(f_n, \frac{C_1}{s} \ldots \frac{C_n}{s}, R_1 \ldots R_n, R_S\right)\right] - \text{Re}_{n,fn} \end{pmatrix}$$

Equation 43

$$f(\vec{P_k}) = \begin{pmatrix} f_{1,X} \\ f_{2,X} \\ \vdots \\ f_{n,X} \\ f_{1,R} \\ f_{2,R} \\ \vdots \\ f_{n,R} \end{pmatrix} \begin{pmatrix} \text{Im}\left[Z_n\left(f_1, \frac{C_1}{s} \ldots \frac{C_n}{s}, R_1 \ldots R_n, R_S\right)\right] - X_{n,f1} \\ \text{Im}\left[Z_n\left(f_2, \frac{C_1}{s} \ldots \frac{C_n}{s}, R_1 \ldots R_n, R_S\right)\right] - X_{n,f2} \\ \vdots \\ \text{Im}\left[Z_n\left(f_n, \frac{C_1}{s} \ldots \frac{C_n}{s}, R_1 \ldots R_n, R_S\right)\right] - X_{n,fn} \\ \text{Re}\left[Z_n\left(f_1, \frac{C_1}{s} \ldots \frac{C_n}{s}, R_1 \ldots R_n, R_S\right)\right] - \text{Re}_{n,f1} \\ \text{Re}\left[Z_n\left(f_2, \frac{C_1}{s} \ldots \frac{C_n}{s}, R_1 \ldots R_n, R_S\right)\right] - \text{Re}_{n,f2} \\ \vdots \\ \text{Re}\left[Z_n\left(f_n, \frac{C_1}{s} \ldots \frac{C_n}{s}, R_1 \ldots R_n, R_S\right)\right] - \text{Re}_{n,fn} \end{pmatrix}$$

In the next step in the process of the present invention, the Jacobian matrix is defined. This is the matrix of first order derivatives of the vector function. It is the equivalent to the gradient in a one-dimensional case.

$$I(\vec{P}) = \frac{\partial f_i}{\partial P_j} =$$

Equation 44

$$\begin{bmatrix} \frac{\partial f_{1,C}}{\partial C_1} & \frac{\partial f_{1,C}}{\partial C_2} & \cdots & \frac{\partial f_{1,C}}{\partial C_n} & \frac{\partial f_{1,C}}{\partial R_1} & \frac{\partial f_{1,C}}{\partial R_2} & \cdots & \frac{\partial f_{1,C}}{\partial R_n} \\ \frac{\partial f_{2,C}}{\partial C_1} & \frac{(\partial f_{2,C})}{(\partial C_2)} & \cdots & \frac{(\partial f_{2,C})}{(\partial C_n)} & \frac{(\partial f_{2,C})}{(\partial R_1)} & \frac{(\partial f_{2,C})}{(\partial R_2)} & \cdots & \frac{(\partial f_{2,C})}{(\partial R_n)} \\ \vdots & \vdots & \ddots & \vdots & \vdots & \vdots & \ddots & \vdots \\ \frac{\partial f_{n,C}}{\partial C_1} & \frac{\partial f_{n,C}}{\partial C_2} & \cdots & \frac{\partial f_{n,C}}{\partial C_n} & \frac{\partial f_{n,C}}{\partial R_1} & \frac{\partial f_{n,C}}{\partial R_2} & \cdots & \frac{\partial f_{n,C}}{\partial R_n} \\ \frac{\partial f_{1,R}}{\partial C_1} & \frac{\partial f_{1,R}}{\partial C_2} & \cdots & \frac{\partial f_{1,R}}{\partial C_n} & \frac{\partial f_{1,R}}{\partial R_1} & \frac{\partial f_{1,R}}{\partial R_2} & \cdots & \frac{\partial f_{1,R}}{\partial R_n} \\ \frac{\partial f_{2,R}}{\partial C_1} & \frac{\partial f_{2,R}}{\partial C_2} & \cdots & \frac{\partial f_{2,R}}{\partial C_n} & \frac{\partial f_{2,R}}{\partial R_1} & \frac{\partial f_{2,R}}{\partial R_2} & \cdots & \frac{\partial f_{2,R}}{\partial R_n} \\ \vdots & \vdots & \ddots & \vdots & \vdots & \vdots & \ddots & \vdots \\ \frac{\partial f_{n,R}}{\partial C_1} & \frac{\partial f_{n,R}}{\partial C_2} & \cdots & \frac{\partial f_{n,R}}{\partial C_n} & \frac{\partial f_{n,R}}{\partial R_1} & \frac{\partial f_{n,R}}{\partial R_2} & \cdots & \frac{\partial f_{n,R}}{\partial R_n} \end{bmatrix}$$

The values of the current iteration are defined by the values of the previous iteration, the vector function, and the Jacobian matrix.

$$\vec{P}_{k+1} = \vec{P}_k - [f(\vec{P}_k)]^{-1} \cdot f(\vec{P}_k) \quad \text{Equation 45}$$

The difference between the current iteration and the previous iteration is substituted into the above equation.

$$\Delta \vec{P}_k = \vec{P}_{k+1} - \vec{P}_k \quad \text{Equation 46}$$

The substitution avoids the inversion of the Jacobian, which is a costly operation when carried out on a computer or processor, and can lead to delays in a real-time implementation.

$$\Delta \vec{P}_k = -[J(\vec{P}_k)]^{-1} \cdot f(\vec{P}_k) \quad \text{Equation 47}$$

Rearranging the above equation yields a linear system of equations that can be solved for Pk.

$$J(\vec{P}_k) \cdot \Delta \vec{P}_k = -f(\vec{P}_k) \quad \text{Equation 48}$$

The values of the current step are calculated from those of the previous step, and the difference between them. Equation 46 is updated with these new values. Then Equation 46 is solved again for ΔPK. Then Equation 49, below, is solved again with this new ΔPK.

The procedure is carried out repeatedly, until the difference is smaller than the initially defined threshold, the estimated value is sufficiently close to the actual value, and the iterative process is stopped.

As the reader will appreciate the processor carries out steps involving equation by storing, reading and updating data.

$$\vec{P}_{k+1} = \vec{P}_k + \Delta \vec{P}_k \quad \text{Equation 49}$$

The values of the last iteration are the approximate solution of the initially formulated system of equations. As mentioned above, the capacitance values of the vector below are divided by the scaling factor.

$$\vec{P}_{final} = \begin{pmatrix} C_{1,final} \\ C_{2,final} \\ \vdots \\ C_{n,final} \\ R_{1,final} \\ R_{2,final} \\ \vdots \\ R_{n,final} \end{pmatrix} \quad \text{Equation 50}$$

With a constant incoming stream of measured impedances, the apparatus of some embodiments is capable of determining sensor capacitances in real time.

Figure 12:
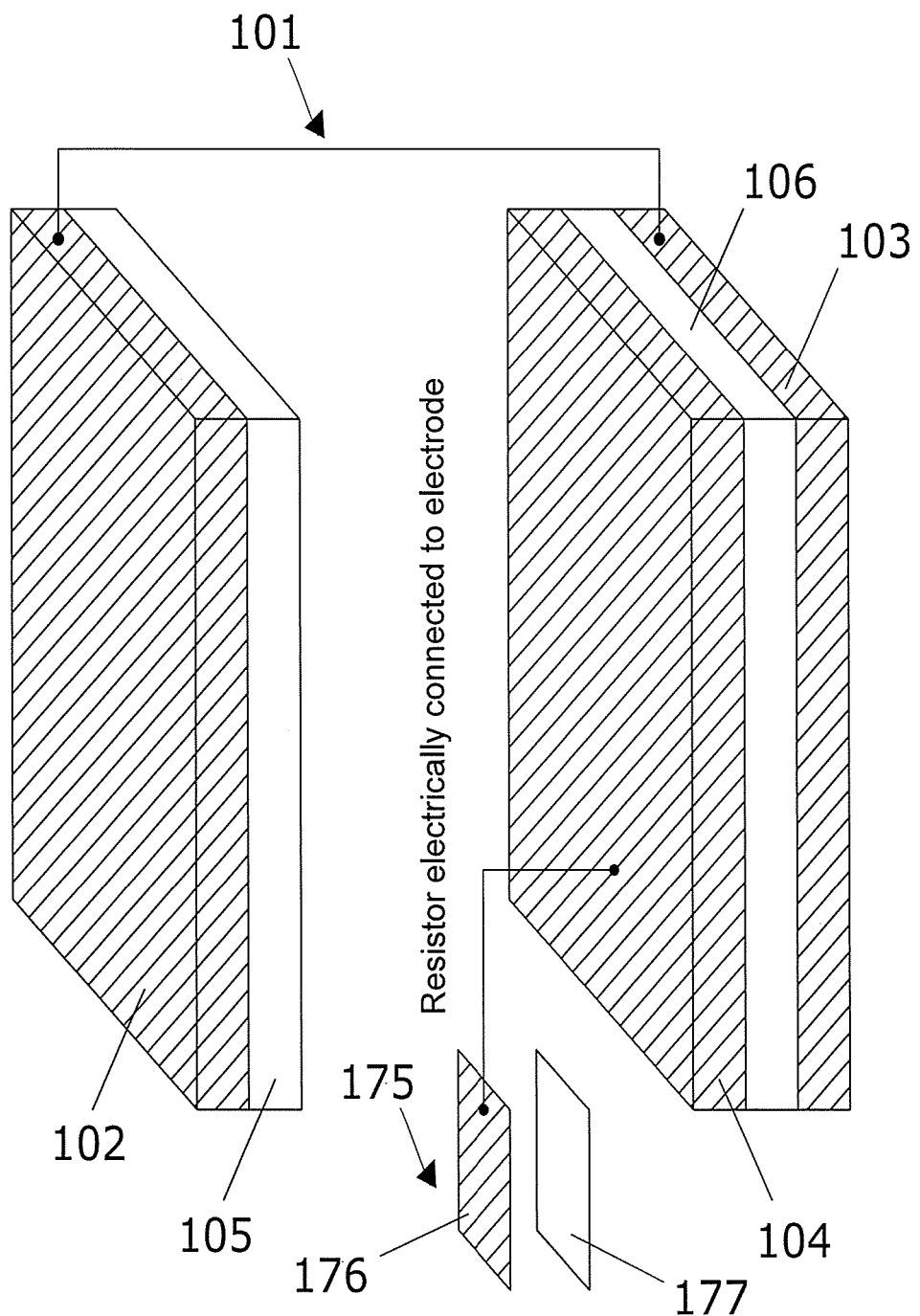
FIG. 12 shows a capacitive sensor and integrated resistor according to a further embodiment of the present invention.

FIG. 12 shows a capacitive deformation sensor 101 with integrated resistor 175 according to an embodiment of the present invention. The sensor 101 has outer electrodes 102 and 103 and an inner electrode 104 formed of a conductive fabric. In this example the conductive fabric of the electrodes 102, 103 and 104 have a resistance in the order of Ohms. As shown, the inner electrode 104 is separated from the outer electrodes 102 and 103 by dielectric layers, or dielectrics, 105 and 106. The outer electrodes 102 and 103 are connected in common to an outer electrode terminal (not shown) and the inner electrode is connected to an inner electrode terminal (not shown). The dielectrics 105 and 106 separate the outer electrodes 102 and 103 from the inner electrode 104 to provide a measurable capacitance.

The spacer resistor 175 is formed of conductive electrode material, or resistor material, 176 bonded to non-stretchable backing material 177. The backing material 177 when bonded to the electrode material 176 resists stretching in the electrode material 176 to mitigate stretch-dependent changes in resistance. The resistance of the resistor 175 can therefore be determined and the resistor can be treated as a resistance component of known resistance, or selected resistance, in an electrical circuit. In this example the backing material 177 is non-conductive and capable of electrically insulating overlapping sections of resistor material from the electrode 104.

The spacer resistor 175 is located between the inner electrode 104 and the dielectric 106 with the resistor material placed in contact with the inner electrode 104 to form an electrical contact. The resistor 175 extends by a defined length from the periphery of the electrode 104. Connection of the inner electrode of the sensor 101 can be made via the resistor 175 to provide the sensor 101 with the resistor providing a physical terminal. The resistor 175 also provides a resistance in series with the capacitance of the sensor 101 by the resistance of the resistor material between a point (not shown) which act as a terminal and the inner electrode 104.

As the reader may appreciate non-stretchable material performs an isolating function in this embodiment. Any exposed resistance material will be isolated with a non-conductive layer, such as non-stretchable backing, or silicone. The width, length, thickness and composition of the resistor material determine the resistance. Selection of these allows selection of the resistance.

The resistance is defined by the aspect ratio of the resistor tab, the thickness, volume ratio between conductive particles and non-conductive elastomer, the particle size of conductive particles dispersed in a matrix material of the electrode. Once an electrode sheet is cast at a set thickness, the resistance can be set by varying width and length of the piece that is cut out. The defining parameter is the material's sheet resistance, which is its bulk resistivity divided by its thickness. At a sheet resistance of 10 kOhm, an aspect ratio of L/W=5 would result in a resistance of 5×10 kOhm=50 kOhm.

Figure 13:
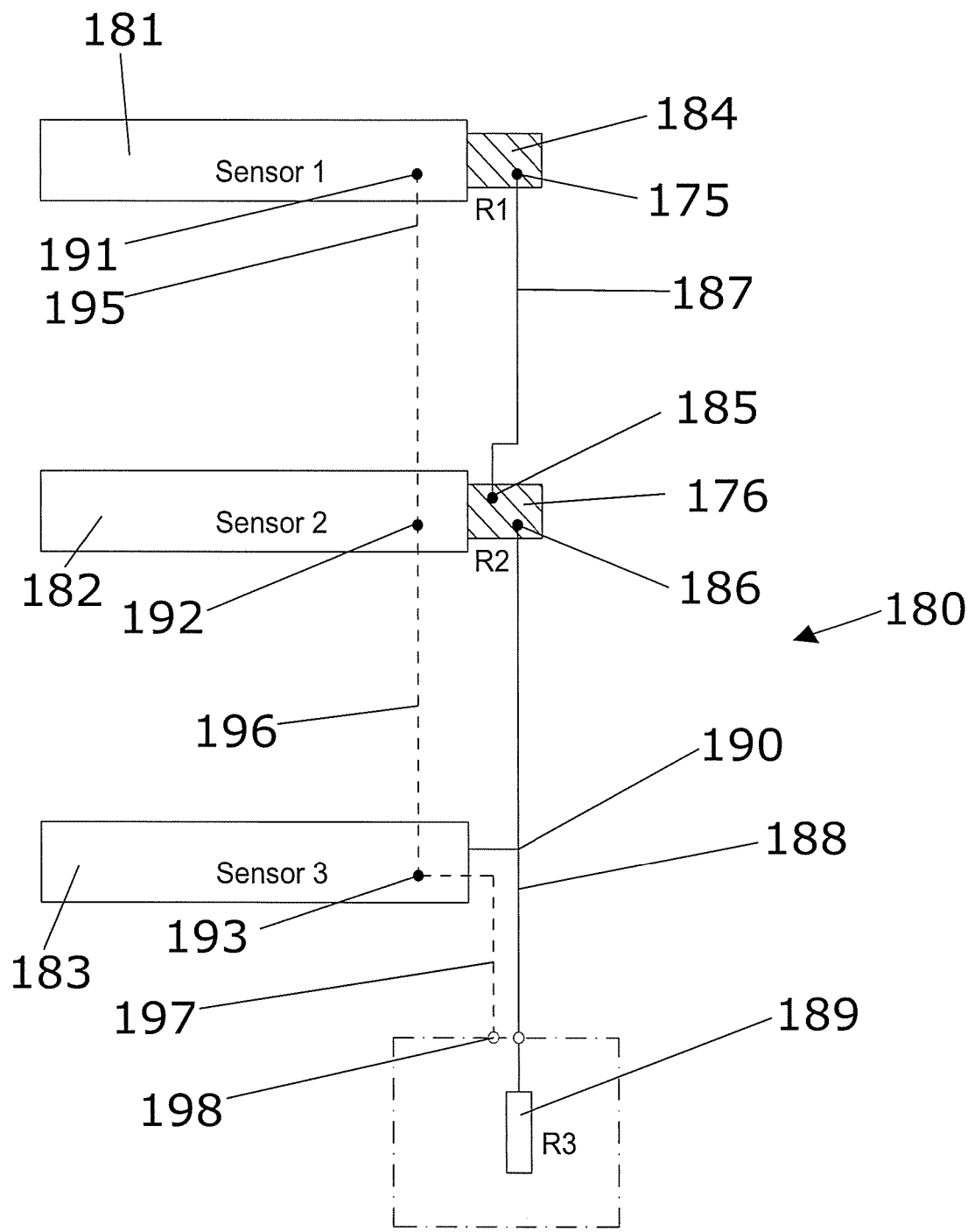
FIG. 13 shows a device with an array of sensors according to the embodiment of FIG. 12.

FIG. 13 shows an electric circuit 180 with capacitive sensors and resistors according to the same embodiment of the present invention as FIG. 12. In this example the electric circuit 180 is an array of deformation sensing capacitors 181, 182 and 183 separated electrically by resistors 175 and 176. The sensors 181-183 have a characteristic capacitance which changes as sensors are stretched or otherwise deformed. The resistor 175 extends from the sensor 181 and provides both a series resistance and a connection terminal 184 for the sensor.

The resistor 176 extends from the sensor 182 and provides two connection terminals 185 and 186 for the sensor 182 and a series resistor between sensor 182 and the terminal 186. The terminals 185 and 186 are spatially separated to provide a length of resistor material between the terminals. Selected properties of the resistor material and/or the length of resistor material provide determine the resistance component value for this resistance between the terminals 185 and 186. Similarly, a resistance between the electrode of the sensor and the terminal 185 can be provided. However, in this example this resistance between the sensor 182 and terminal 185 is minimised and treated as negligible so the terminal 186 can be treated as connected directly to the inner electrode (not shown) of the sensor 182.

A connection lead 187 is shown connecting terminal 184 to 185. Another connection lead 188 shown connecting terminal 186 to an array signal terminal 189 for the array and to terminal 190 of sensor 183.

The sensors 181, 182 and 183 have ground terminals 191, 192 and 193 respectively. The terminals connect to the outer electrodes (not shown) of the capacitive sensors 181-183. The sensor ground terminals 191-193 are connected by connecting leads 195 and 196 and 197 to an array ground terminal 198.

Figure 14:
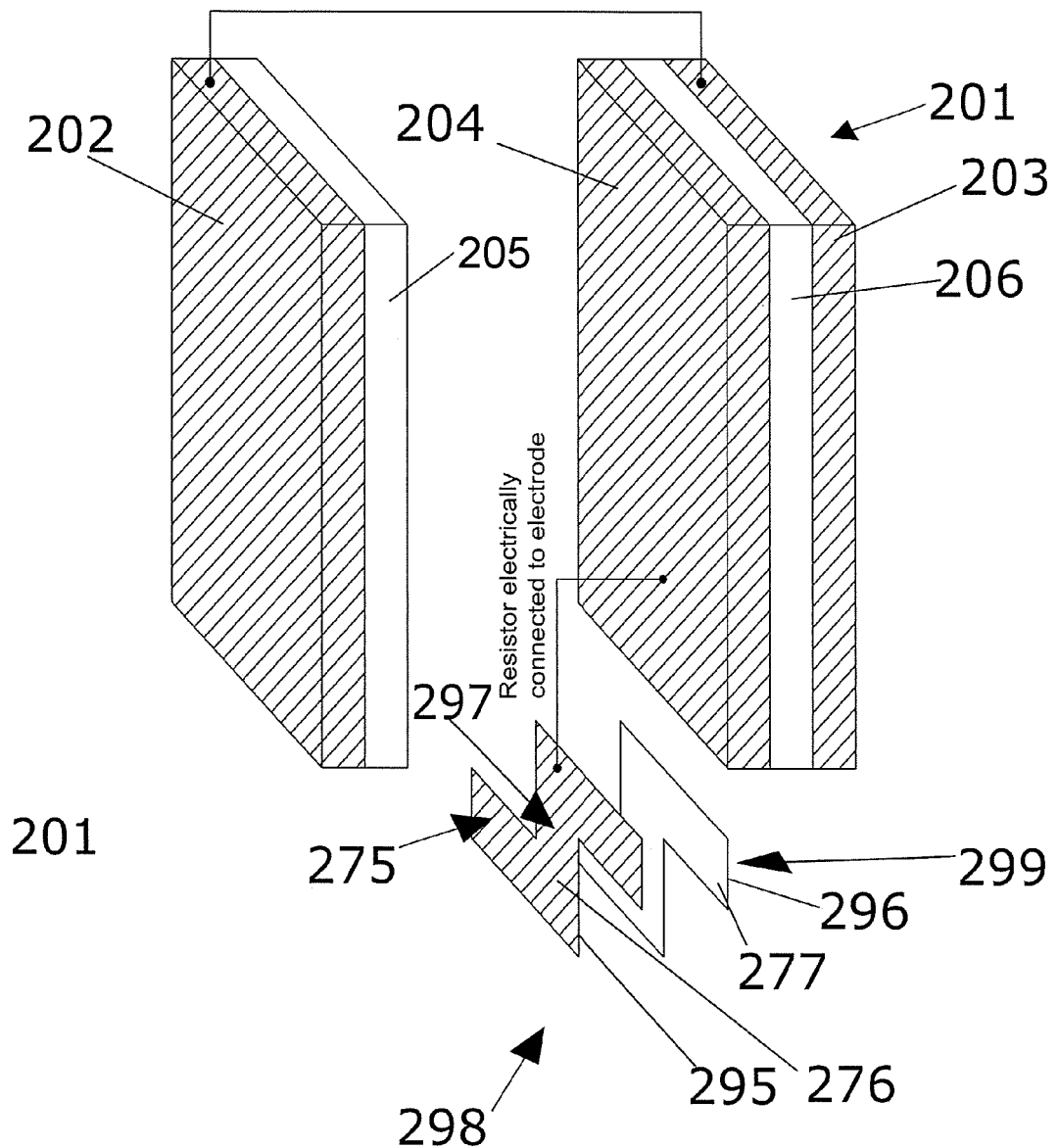
FIG. 14 shows a capacitive sensor and integrated resistor according to a further embodiment of the present invention.

FIG. 14 shows a capacitive deformation sensor 201 with integrated resistor 275 according to another embodiment of the present invention.

The sensor 201 has outer electrodes 202 and 203 and an inner electrode 204 formed of a conductive fabric. In this example the conductive fabric of the electrodes 202, 203 and 204 have a resistance in the order of Ohms. As shown, the inner electrode 204 is separated from the outer electrodes 202 and 203 by dielectric layers, or dielectrics, 205 and 206. The outer electrodes 202 and 203 are connected in common to an outer electrode terminal (not shown) and the inner electrode is connected to an inner electrode terminal (not shown). The dielectrics 205 and 206 separate the outer electrodes 202 and 203 from the inner electrode 204 to provide a capacitance measurable across terminals (not shown).

FIG. 14 also shows a resistor 275 with resistive material 276 and stretch-resistant backing material 277. In this example the stretch-resistant backing is dielectric. In this example also the resistive material is an elastomer material with a dispersion of particles to provide a conductive property with defined sheet resistivity.

The resistor 275 is shown with two parallel sections 295 and 296 joined by a transverse section 297. The lengths of the two parallel sections are offset so that each parallel section 295 and 296 provide tabs 298 and 299 extending in opposite directions from the transverse section 297. This shape allows the resistor 275, when arranged between the electrode 204 and dielectric 206 to provide tabs (not shown) which extend from two edges of the sensor 201. This arrangement allows a resistance to be provided between terminals located at two different edges of the sensor 201.

Figure 15:
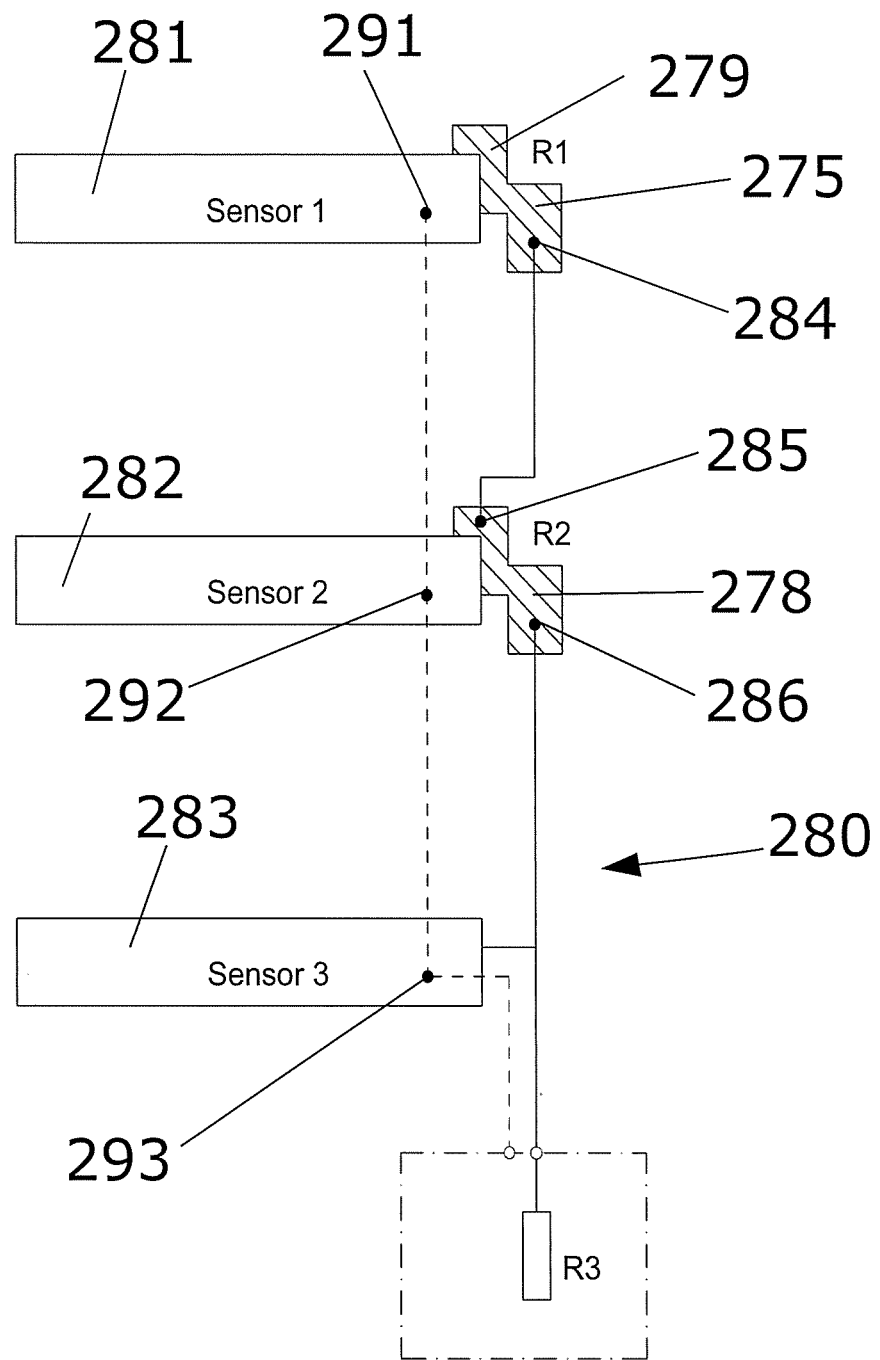
FIG. 15 shows a device with an array of sensors according to the embodiment of FIG. 14.

FIG. 15 shows an electric circuit with resistors according to the same embodiment of the present invention as FIG. 14. In this example the electric circuit is an array 280 of deformation sensing capacitors 281, 282 and 283 separated electrically by resistors 275 and 278. The sensors 281-283 have a characteristic capacitance which changes as sensors are stretched or otherwise deformed. The integrated resistor 275 extends from the sensor 281 and provides two connection terminals 279 and 284 for the sensor 281, each with a series resistance.

The resistor 278 extends from the sensor 282 and also provides two connection terminals 285 and 286 for the sensor 281, each terminal has a series resistance. Selected properties of the resistor material and/or the length between a terminal and another terminal or point of contact (not shown) between resistor material and a sensor electrode provide a selected resistance component value.

In the example shown in FIG. 15, the resistor 275 provides a resistance between the sensor 281 and the terminal 284. The resistor 278 provides a terminal for the sensor 282 and also provides a resistance between the sensor 282 and the terminal 286.

Similarly, a resistance between the electrode of the sensor 282, similar to electrode 104, and the terminal 285 can be provided. However, in this example this resistance between the sensor 282 and terminal 285 is minimised and treated as negligible. Similarly to the embodiment of FIG. 9, the ground electrodes 291-293 are connected to the array ground terminal 296.

Figure 16:
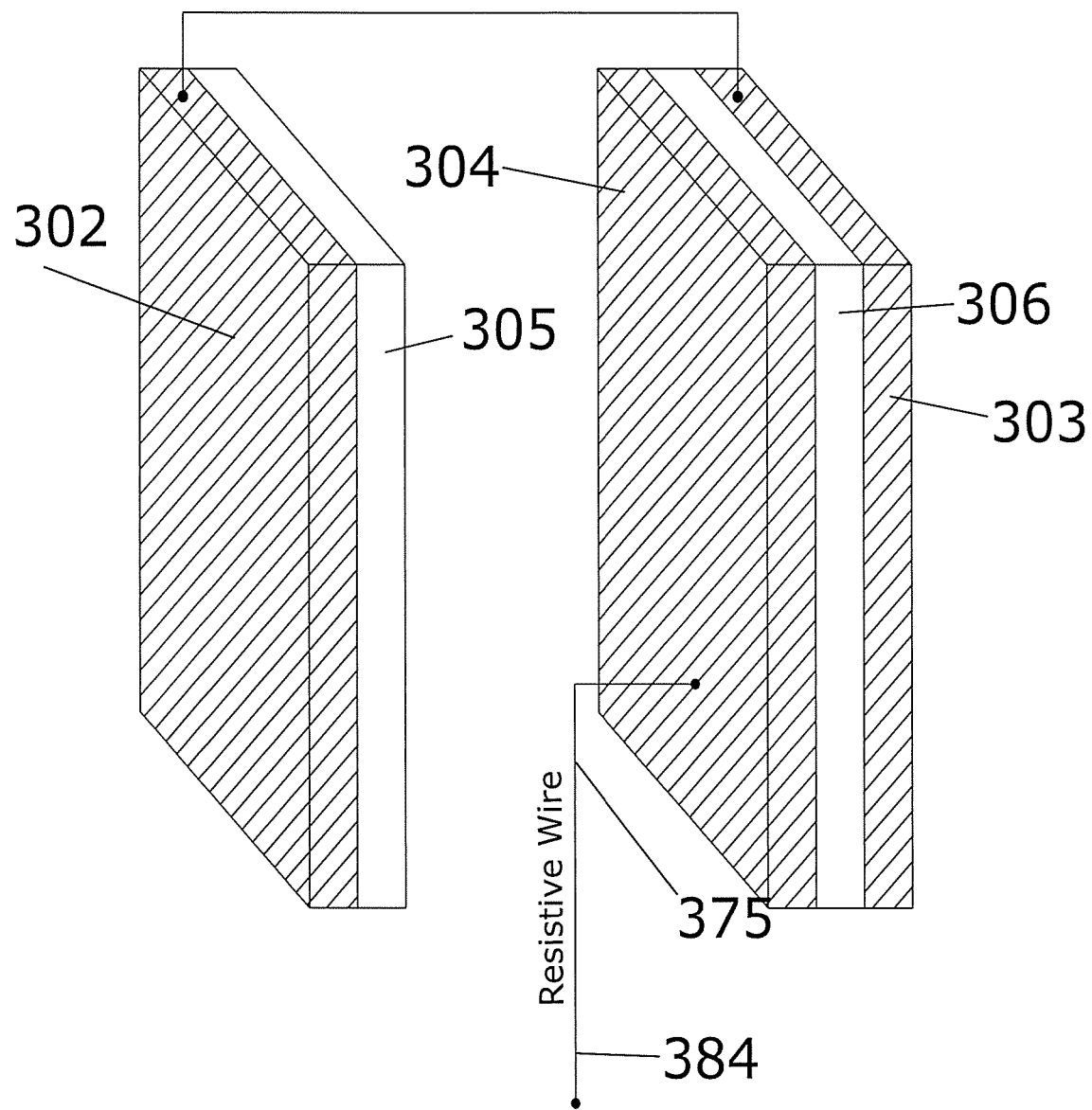
FIG. 16 shows a capacitive sensor and integrated resistor according to a further embodiment of the present invention.

FIG. 16 shows a sensor with integrated resistor 375 according to a further embodiment of the present invention. In this embodiment the resistor is formed by a selected length of resistive wire of selected resistivity and with selected length extending from a point of contact (not shown) with the signal electrode 304 of the sensor 301. The resistive wire is included between the electrode and the dielectric which are subsequently bonded in place and which hold the resistor in place.

Figure 17:
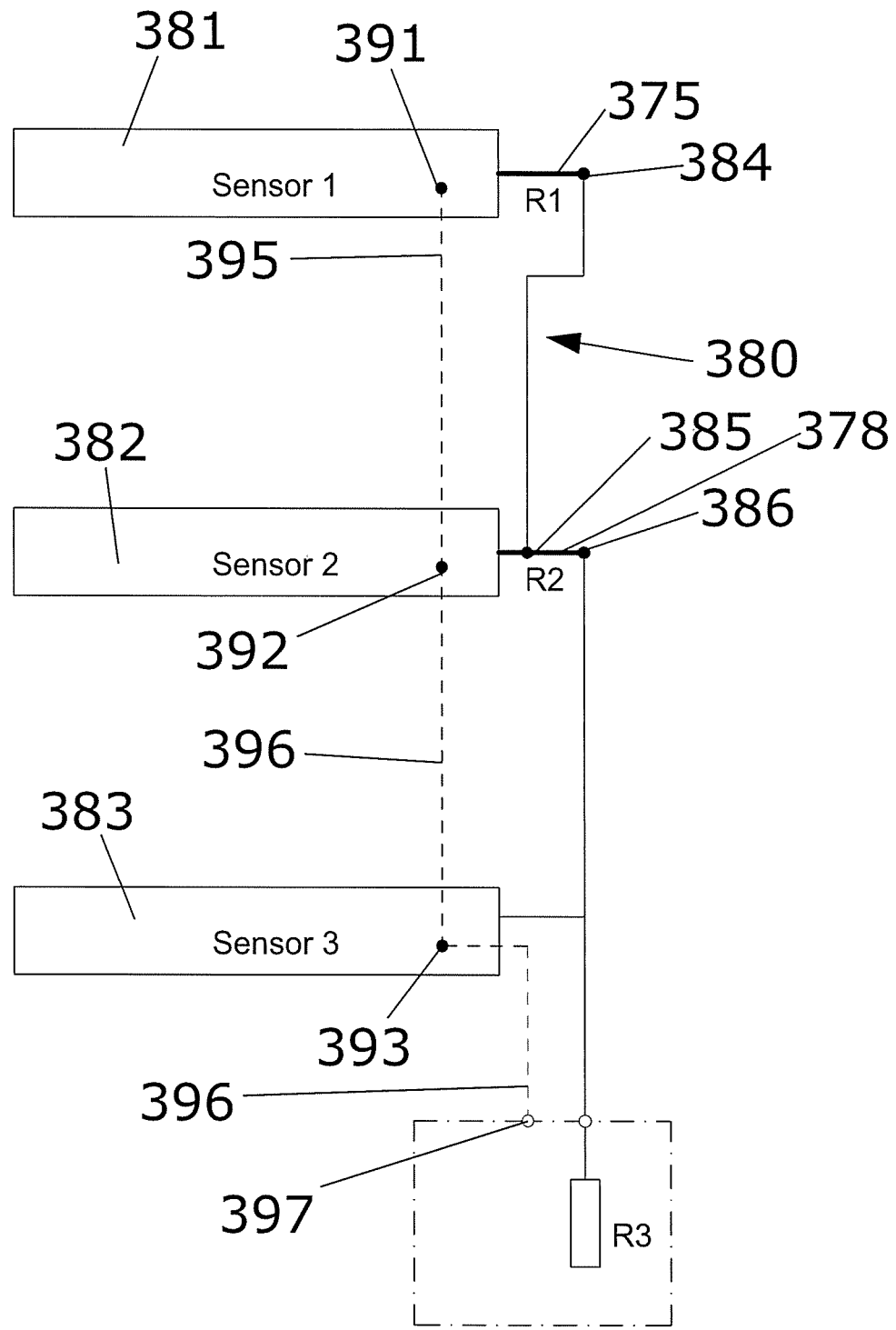
FIG. 17 shows a device with an array of sensors according to the embodiment of FIG. 16.

FIG. 17 shows an array according to the same embodiment as FIG. 16. The array has 3 sensors with two spacer resistors 375 and 378 formed of resistive wire. The resistor 378 provides a terminal for the sensor 382 which is connected to the terminal 385 closest to the sensor 382. The resistor 378 also provides a second terminal 386 and a resistance between terminal 375 and the sensor 383. Similarly to embodiments of FIGS. 9 and 11 the electrodes and of the sensors are connected to an array ground terminal 397.

Figure 18:
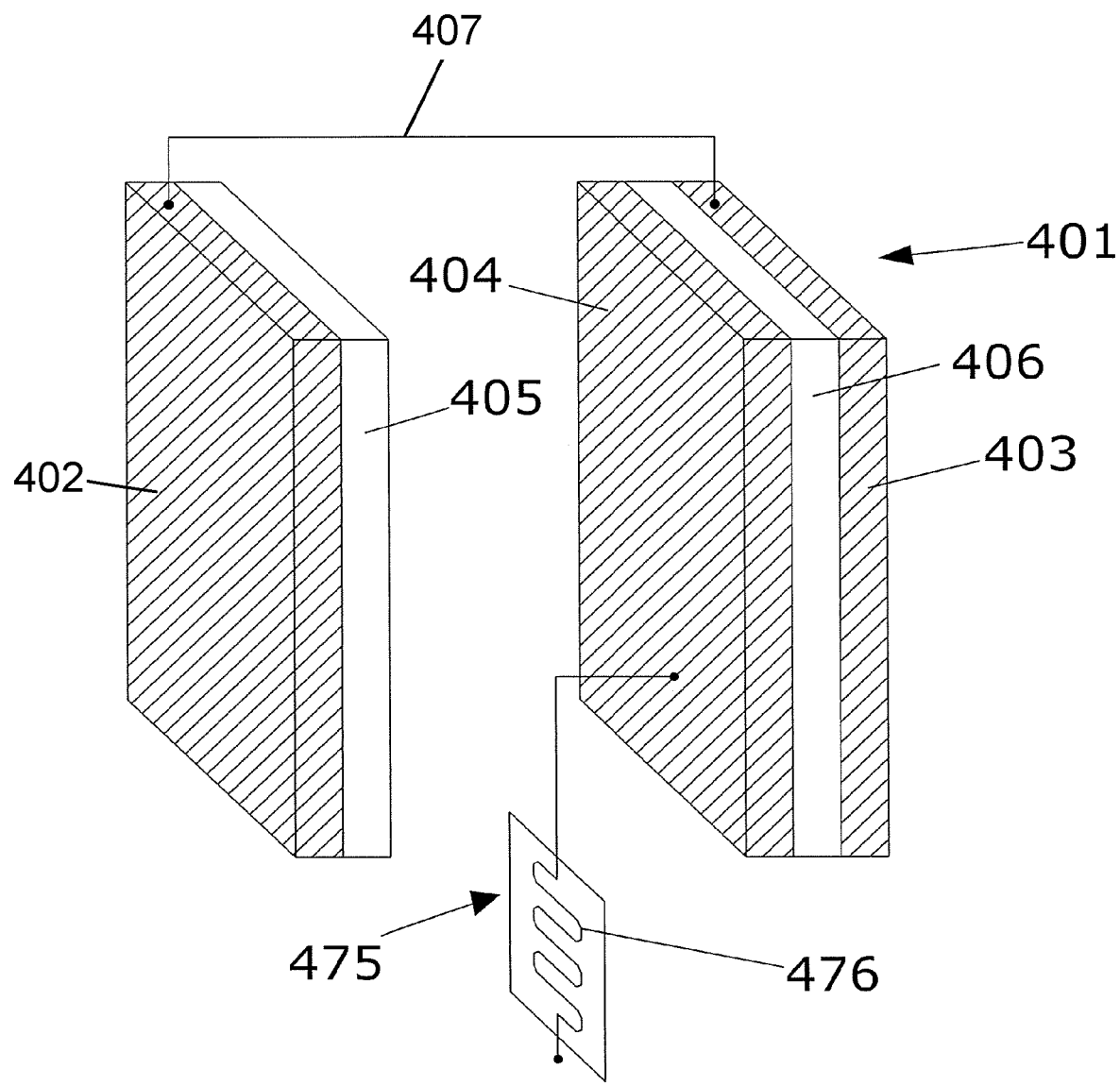
FIG. 18 shows a capacitive sensor and integrated resistor according to a further embodiment of the present invention.

FIG. 18 shows a capacitive deformation sensor 401 with integrated resistor 475 according to another embodiment of the present invention.

The sensor 401 has outer electrodes 402 and 403 and an inner electrode 404 formed of a conductive fabric. In this example the conductive fabric of the electrodes 402, 403 and 404 have a resistance in the order of Ohms. As shown, the inner electrode 404 is separated from the outer electrodes 402 and 403 by dielectric layers, or dielectrics, 405 and 406. The outer electrodes 402 and 403 are connected in common to an outer electrode terminal 407 and the inner electrode is connected to an inner electrode terminal. The dielectrics 405 and 406 separate the outer electrodes 402 and 403 from the inner electrode 404 to provide a capacitance measurable across outer and inner electrode terminals.

The resistor 475 of this embodiment is formed of a length of resistive yarn 476 which is woven into a backing sheet 477 of material. In this example the material is a fabric. The resistance is determined by the selection of the yarn 476 for resistivity and by the length of the yarn 476. The yarn 476 shown has an undulating pattern.

Figure 19:
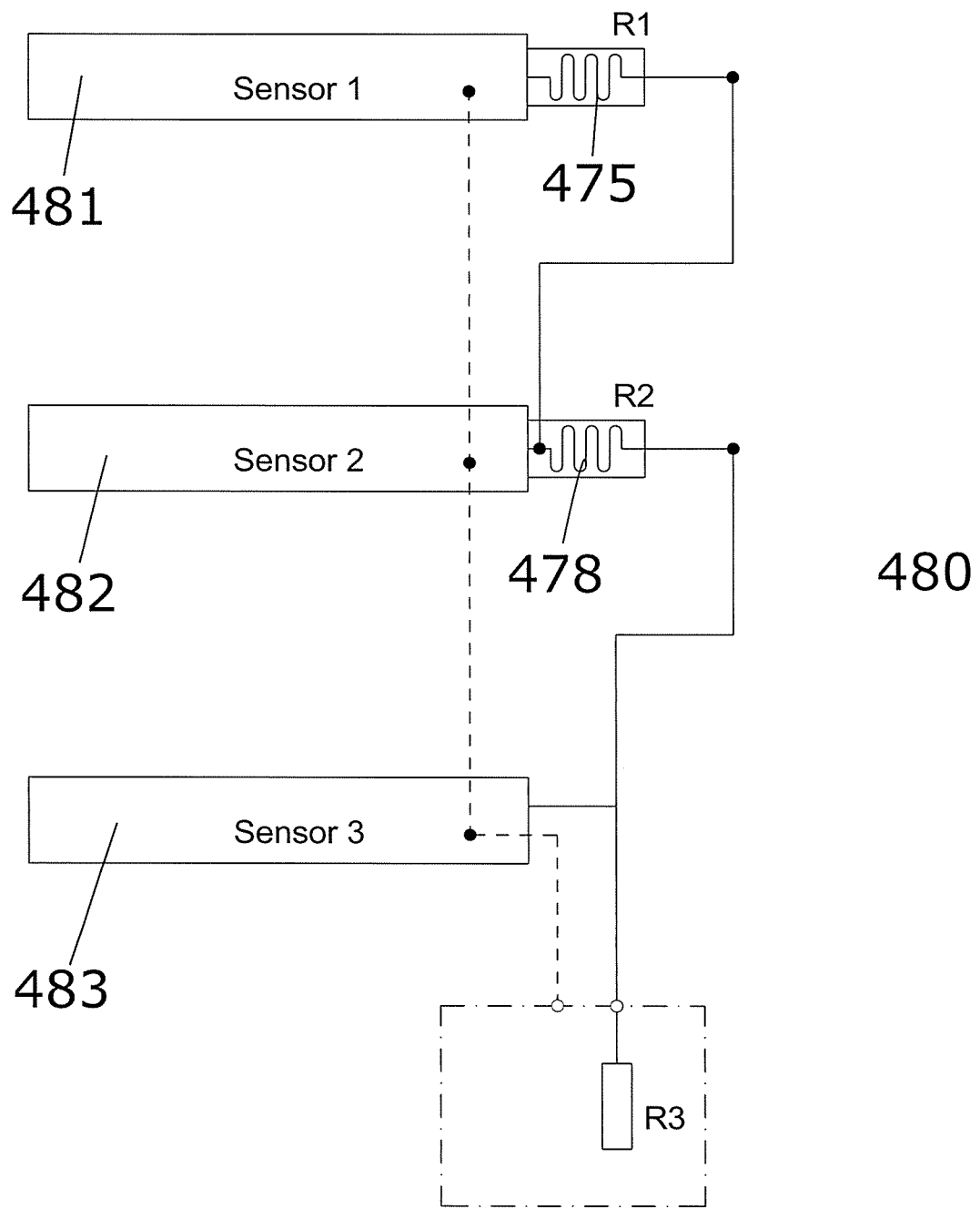
FIG. 19 shows a device with an array of sensors according to the embodiment of FIG. 18.

FIG. 19 shows an array of sensors 480 according to the same embodiment as FIG. 14. The array 480 has 3 sensors 481, 482 and 483 with two spacer resistors formed of resistive, conductive yarn woven into a backing material. The sensors 481-483 and resistors 475 and 478 are shown connected similarly to those of the sensor array of FIG. 13.

Figure 20:
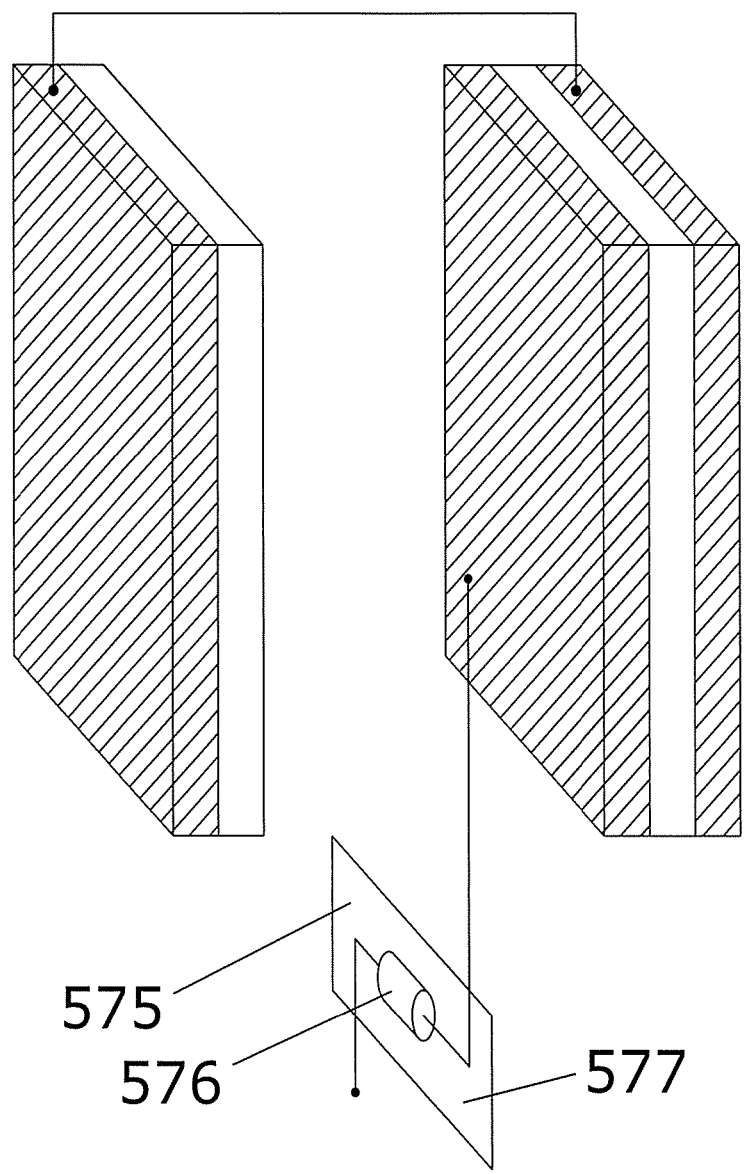
FIG. 20 shows a capacitive sensor and integrated resistor according to a further embodiment of the present invention.

FIG. 20 shows a sensor similar to the sensors of FIGS. 12, 14, 16 and 18 except that the resistor 575 is formed of a resistor component, such as a metal-film resistor or ceramic resistor 576 bonded to a non-stretchable substrate 577.

Figure 21:
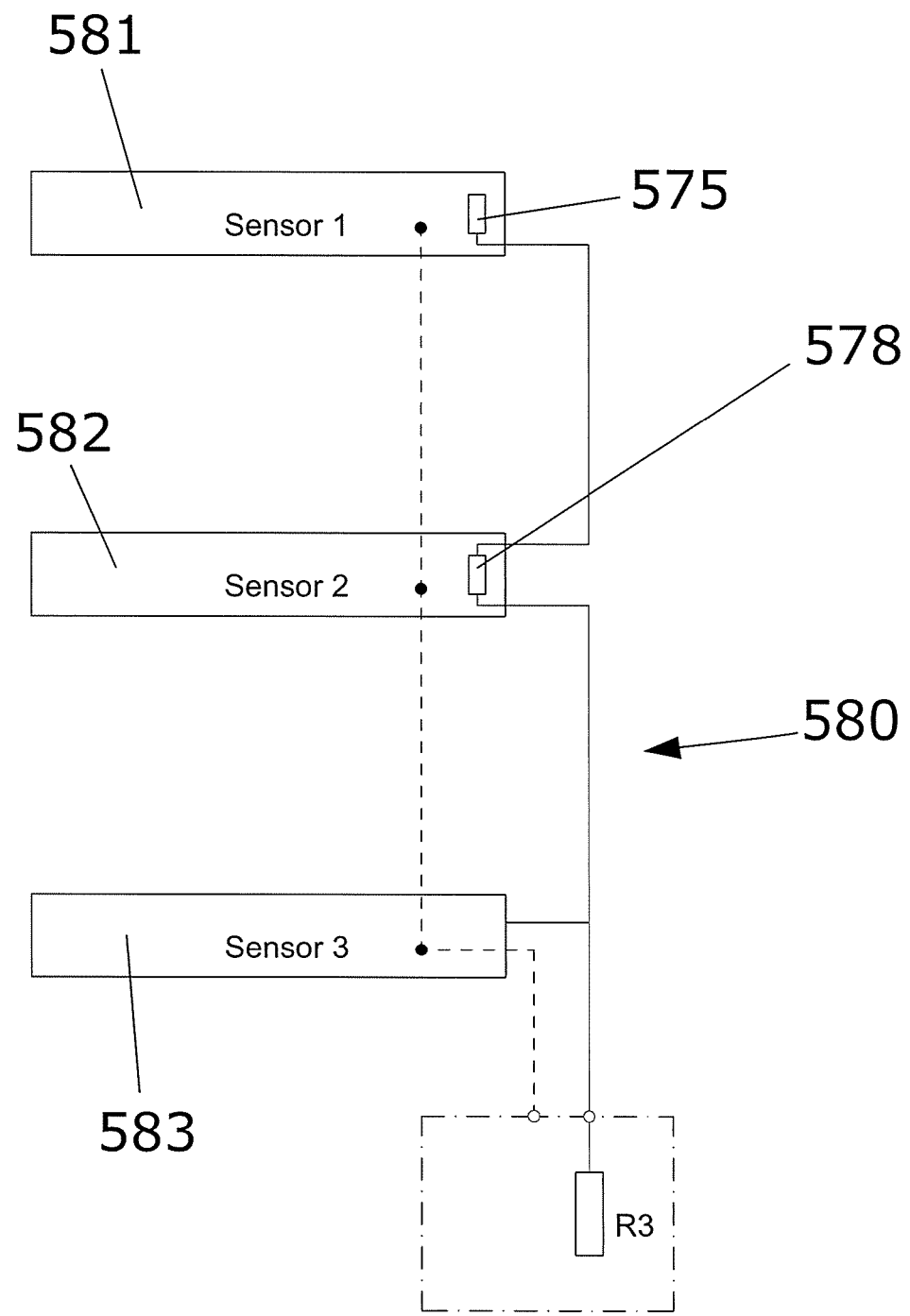
FIG. 21 shows a device with an array of sensors according to the embodiment of FIG. 20.

FIG. 21 shows a sensor array 580 The array is connected similarly to the array shown in FIG. 17 for example. The array has sensors 581, 582, resistors 575 and 576 connected similarly to the sensor array of FIGS. 9, 11, 13 and 15.

Further, additional and alternative embodiments of the present invention will now be described.

In some embodiments where the lead resistances are unknown, the lead resistances are still higher than the electrode resistances of the capacitive sensors. In some embodiments capacitive sensors formed of conductive fabric and the leads are formed of conductive elastomer. In some embodiments the resistance of the electrodes is in the range of a few Ohms. In some embodiments the leads have resistance in the range of tens of kOhms.

In some embodiments the capacitive sensors may be affixed to a stretchable substrate material. In some embodiments the stretchable substrate material is a fabric.

Various embodiments of the present invention comprise apparatus or computer implementations with modules described herein divided and/or grouped into modules of any alternative implementation known to the reader.

Embodiments of the present invention may be a sensor capable of sensing multiple modes of deformation while requiring only a single pair of terminals. This embodiment may be considered by the reader as providing a means of multiplexed deformation or capacitive sensing.

Embodiments of the present invention perform numerical calculations, expressed herein in mathematical form, using any suitable computational steps known to the reader. These include instantiating data structures, variable or classes, storing, writing and reading data values, generating, storing, writing or reading data pointers, invoking functions, and applying computer readable rules. For example, 'writing' or 'expressing' an equation may be performed in various embodiments by storing data using a defined data structure.

Also for example, steps involving phasors for voltages and/or currents may be implemented as operations on data carrying information on the voltages and/or currents.

Also for example, mathematical steps on equations described herein may be implemented as operations involve data carrying information on vectors or matrices.

In various embodiments the capacitance of each individual capacitive sensor can be measured.

Various embodiments allow measurement of each individual capacitive sensor.

In various embodiments solutions to the capacitances of the capacitive sensors, or variable capacitors, are found periodically.

In various alternative embodiments solutions to the capacitances of the capacitive sensors, or variable capacitors, are found upon an event occurring.

In some capacitive sensors are decoupled and can be deformed independently. In other embodiments the capacitive sensors are affixed with defined relative orientation onto a fabric or sheet of material which will deform. In these embodiments the capacitive sensors can have a defined mechanical coupling. In some embodiments the capacitive sensors are mechanically coupled.

In alternative embodiments the first sensor resistor may be omitted from the deformation sensor and included in sensor electronics. This embodiment provides a deformation sensor with only two terminals.

In alternative embodiments the sensing resistors are formed of a printable or settable liquid material and a deformation resistant material. Some embodiments may have material which doped with conductive material.

Some embodiments may maintain constant resistance by the deformation resistant material resisting deformation of the resistor material. Some embodiments may have sensor resistors which have off-the-shelf resistances which can be selected.

The electrode resistances of the capacitive sensors are approximately 5 Ohms.

In some embodiments the sensing resistors are selected to have values which allow excitation signals to charge capacitors far from the excitation terminals 19 and 20 and also to ensure that reactances of the sensor circuit as determined by relating the excitation voltage signal to the sensing signal, representing current through the sensor circuit 10, can be resolved at each frequency component.

Alternative embodiments of the invention use an equivalent process as illustrated herein to measure resistances in a sensor circuit which has variable resistances and selected capacitances.

Alternative embodiments of the invention use an equivalent process as illustrated herein to measure resistances in a sensor circuit which has variable resistances adapted to vary resistance with deformation for sensing and selected capacitances.

Alternative embodiments of the invention use an equivalent process as illustrated herein to measure resistances in a sensor circuit which has variable resistances adapted to vary resistance with deformation for sensing and capacitances which also vary for sensing.

Alternative embodiments of the invention use an equivalent process as illustrated herein to measure resistances in a sensor circuit which has a combination of variable resistances, fixed resistances, selected capacitances and variable capacitances.

In various embodiments a vector function for impedance, or a model which is manifest in the vector function, neglects resistance of the electrodes of the capacitors.

In alternative embodiments signal frequency components may be provided by a broad spectrum signal and the frequency components are selected in the sensing signal by filtering. In some embodiments, filtering may be performed on a sensing signal and/or a copy of an excitation signal used to measure reactance.

In alternative embodiments signal frequency components may be provided by a broad spectrum signal and the frequency components are selected in the sensing signal by filtering.

In alternative embodiments to that described with reference to FIG. 1 and a capacitive sensor has additional layers of electrodes. These may be additional layers of given electrodes described or additional sets of the electrodes described.

Other alternative embodiments may have fewer layers of electrode.

Some alternative embodiments may have a single and/or exposed electrode which provides a capacitance with another body or element so as to sense the presence, proximity of the body or element, or to sense charge on the body or element, or to sense other properties as known to the reader.

In various alternative embodiments the electrodes may be formed of matrix materials containing conductive material or supporting conductive layers or conductive elements. For example, the electrodes may be formed of silicon.

Various embodiments of the present invention allow conductive elastomer tracks to be used in place of metal wires.

Various embodiments of the present invention allow multiple sensor capacitances to be measured through a single physical channel.

In various embodiments of the present invention the only fixed parameters required to be known are the frequencies of components of the excitation voltage and the shunt resistor value RS.

In various embodiments, estimations of the actual values of resistances and capacitances are sufficient. In these embodiments therefore conductive tracks with variable resistances can be used.

Embodiments of the present invention provide an apparatus that reduces the number of electrical connections needed to connect a soft electronic circuit to the sensing apparatus.

Embodiments of the present invention provide a means to connect the soft electronic sensing circuit through soft conductive leads instead of metal wires.

Embodiments of the present invention provide a means to connect the soft electronic sensing circuit through leads with variable resistance.

In some embodiments sinusoidal excitation voltages are applied simultaneously. An FFT is performed on the voltages VE and VRS. This yields the amplitudes of both signals, and the phase shift between them.

In some embodiments the stretch sensors are made from conductive fabric. Conductive fabric electrodes are separated by a silicone dielectric. The resistance of the electrodes is in the range of Ohms.

In various embodiments the resistance of the conductive elastomer tracks is considerable higher, such as in the range of approx. 10 kOhms to approximately 100 kOhms.

In some embodiments approximate values of resistors and capacitors have to be known for the Newton Raphson solver to work. +/−50% of the known resistance or capacitance are reasonable estimations. Based on a an analytical model of reactances and resistances, the Newton Raphson solver calculates sensor capacitances and track resistances iteratively; it stops as soon as the change in between two iterations is less than a previously defined tolerance. Then, the iteration process starts again.

Therefore, in some embodiments the sensing apparatus reads a store of calibration data for the resistances and capacitances. The calibration data may include resistances and capacitances at a given state of rest or deformation of the soft electronic circuit.

In some embodiments the capacitances are the range of hundreds of Picofarads.

In some embodiments the conductive elastomer tracks are made from a mix of silicone and carbon; their resistance is defined by their length, width, thickness, size of conductive particles, volume ratio between conductive particles and silicone.

On a sensing garment, in the case of some embodiments applied to garment sensing, the conductive tracks are stretched when a body covered by the garment moves. The stretch changes the electrical resistance of the tracks. The numerical solver module for this sensing method accounts for this change.

In various embodiments frequencies of the excitation voltage frequency components are in the range of 1 kHz to 100 kHz.

In various embodiments amplitudes of the excitation voltages are approximately 5 Volts for each frequency.

Some embodiments allow variable resistors. In these embodiments conductive elastomers used in leads to change their resistance under strain, and are also known to exhibit transient behaviour. Therefore, the resistance of conductive tracks on a sensing garment may not be constant.

Various embodiments of the present invention are characterised by the following: Soft capacitive stretch sensors with highly conductive electrodes.

Conductive elastomer leads or tracks made from conductive particles that are suspended in a non-conductive elastomer matrix.

In various embodiments the resistivity of the tracks connecting the capacitive sensors is higher than that of metal. Therefore, multiple sensors are interconnected with these resistive tracks, which results in a sensor array circuit which can be modelled as R-C transmission line.

In these embodiments the sensor/track transmission line is connected to a single sensing physical channel, where a sinusoidal excitation signal with multiple frequencies is applied; the reactance and resistance of the transmission line is measured at each frequency. In these embodiments measurements are based on voltage and current amplitudes, and the phase shift between voltage and current signals.

A model of the transmission line reactance and resistance is established in this embodiment. The model contains track resistances, sensor capacitances, and frequencies, symbolic expressions and measurements of reactance and resistance are arranged in a system of nonlinear equations.

To solve this system of equations for the unknown track resistances and sensor capacitances, a numerical method is applied. In this embodiment, the Newton Raphson method is used.

In some embodiments a soft electronic component is formed of films or elastomeric material. In some embodiments the component comprises elastomeric material to provide dielectric layers or patterns and elastomeric material with dispersed material to provide conductive layers or patterns. In some embodiments the material of both dielectrics and conductors is silicone.

Various embodiments provide an electrical characteristic which varies with deformation. In some embodiments the electrical characteristic is capacitance. In various embodiments an electrical characteristic is capacitance. In various embodiments an electrical characteristic to be used is inductance. In various embodiments the electrical characteristic is a characteristic which is referenced to earth or to a shielding electrode. For example, capacitance of a signal electrode which stretches may be the capacitance between the signal electrode and one or more shielding electrodes and may be a result of deformation in both the shielding electrode and the signal electrode as well as, in some cases, dielectric layers separating these.

Some embodiments have soft electronics components, such as resistors, leads and capacitors formed of films of elastomeric material separating films of elastomeric material having a dispersion of particles to impart a conductive property to the films. The films of conductive material in some embodiments provide electrodes of soft electronic components. The films of conductive material in some embodiments provide conductors for soft electronic components.

In some embodiments variation in electrical characteristic is used for sensing deformation or changes in deformation.

In some embodiments variation in electrical characteristic is used for generating power. In some embodiments power is generated by holding a priming charge while the electrical characteristic changes.

In some embodiments soft electronic components are used to generate mechanical force.

In some embodiments material used to provide a soft electronic component such as a sensor is a matrix material. In some embodiments the material used to provide a soft electronic component such as a sensor is an elastic material.

In some embodiments material used to provide a soft electronic component such as a sensor is a silicone-based material.

In some embodiments electrodes are formed of a similar material to that of dielectric layers. In some embodiments the electrodes are conductive due to conductive materials, such as particles, being added to a material.

In some embodiments the material of the electrodes and the material of dielectric layers have a similar stretch and/or compliance and/or elastic properties.

In some embodiments the electrical device is formed of films of materials. In some embodiments layers or films of materials are formed of material which is initially liquid and then set or cured.

Some embodiments use a step of casting to manufacture a layer of a sensor. The casting step of some embodiments uses a cast into which a material to be deposited is applied. In some embodiments the casting step is used to apply a layer of conductive material in a defined pattern. The casing may use casts as pattern elements, which define patterns. The resulting product of some embodiments has a layer of the sensor defined by a cast. Some embodiments have a cast layer.

Some embodiments have steps in a process which uses a stencil to deposit a layer of an integrated sensor and/or a pattern of signal electrodes and cable conductors. The stenciling of some embodiments uses stencils as pattern elements, which define patterns for layers and/or a pattern of sensors. Some embodiments have a resulting product with a stencilled layer.

Some embodiments have steps in a process which uses a screen to deposit by screen printing a layer of an integrated sensor and/or a pattern of signal electrodes and cable conductors. The printing of some embodiments uses screens as pattern elements, which define patterns for layers and/or a pattern of sensors. Some embodiments have a resulting product with a screen-printed layer.

Some embodiments have steps in a process which uses digital printing to deposit a layer of an integrated sensor and/or a pattern of signal electrodes and cable conductors. The printing of some embodiments uses computer controlled dispensing heads as pattern elements, which define patterns for layers and/or a pattern of sensors. Some embodiments have a resulting product with a digitally printed layer.

Some embodiments have steps in a process which uses flexography printing to deposit a layer of a sensor and/or a pattern of signal electrodes and cable conductors. The printing of some embodiments uses raised surfaces on planar or rotary tools as pattern elements, which define patterns for layers and/or a pattern of sensors. Some embodiments have a resulting product with a flexographic layer.

Some embodiments have steps in a process which uses gravure to deposit a layer of a sensor and/or a pattern of signal electrodes and cable conductors.

The printing of some embodiments uses embossed patterns on rotary tools as pattern elements, which define patterns for layers and/or a pattern of sensors. Some embodiments have a resulting product with a gravure layer.

Some embodiments have steps in a process which uses offset lithography to deposit a layer of an integrated sensor and/or a pattern of signal electrodes and cable conductors. The printing of some embodiments uses a series of rollers to transfer liquids to a substrate in patterns defined to describe a pattern of layers and/or a pattern of sensors. Some embodiments have a resulting product with an offset lithography layer.

Some embodiments have steps in a process which uses lamination to deposit a prefabricated layer of an integrated sensor and/or a pattern of signal electrodes and cable conductors. The lamination of some embodiments uses prefabricated patterned layers, which define patterns for layers and/or a pattern of sensors and/or cables. Some embodiments have a resulting product with a laminated layer.

Some embodiments of the invention have steps in a process which uses spray deposition, implantation or injection of materials.

Some embodiments of the invention have steps in a process which uses digital printing such as inkjet printing.

Some embodiments have a circuit or processor which determines an electrical characteristic, such as capacitance, for a signal electrode and/or a change in an electrical characteristic determined for a signal electrode and does this dependent on an electrical characteristic and/or change in electrical characteristic determined for a cable connecting the signal electrode to a circuit. The determination dependent on in some embodiments is a deduction. In some embodiments the deduction or other determination is determined dependent on an electrical characteristic and/or change in electrical characteristic for a signal electrode associated with the cable conductor. In some embodiments the signal electrode may be associated geometrically with the cable conductor. In some embodiments the cable conductor may run alongside a signal electrode or sequence of signal electrodes so that the deformation, such as stretching or compression, occurring in the cable can be determined from the deformation occurring in the signal electrode. The reader will appreciate that deformation will involve deformation in cable conductors, signal electrodes and shielding electrodes and/or dielectric layers. In some embodiments the cable may run under, over or beside an associated signal electrode or sequence of these.

In some embodiments resistance of the resistive component is more than about 10 kOhm.

In some embodiments resistance of the resistive component is less than about 100 kOhm.

In some embodiments resistance of the resistive component is in a range of 10 KOhm to 100 kOhm.

In some embodiments the backing material of a resistor may be any material, known to the reader, which is stretch resistant.

In other embodiments the backing material may be operable to stretch to a degree.

In various embodiments the capacitance of each individual capacitive sensor can be measured.

Various embodiments allow measurement of each individual capacitive sensor.

In various embodiments solutions to the capacitances of the capacitive sensors, or variable capacitors, are found periodically.

Other alternative embodiments may have fewer layers of electrode.

In alternative embodiments the capacitor may be a generator which generates power by holding a priming charge while the capacitance is changed by deformation.

Embodiments of the present invention provide arrays of soft capacitive stretch sensors well suited for wearable motion capturing technology, because they are compliant with the human body. Hence, they are unobtrusive, and likely to be tolerated by users. Capacitive stretch sensors are made from stretchable electrodes separated by a soft dielectric.

In various embodiment the capacitor is treated for use in measurements, power generation or other known electronic functions as a device which changes impedance with deformation.

In alternative embodiments to that illustrated with reference to FIG. 6 the measuring apparatus measures resistances series with capacitances in the sensor device so resistive sensors may be used.

In alternative embodiments to that illustrated with reference to FIG. 6 the measuring apparatus a combination of N parameters made of resistances and capacitances measures resistances series with capacitances in the sensor device so a combination of capacitive and resistive sensors.

In various embodiments various combination of unknown capacitances and/or resistances are determined as follows:
Unknown capacitances only:
Im(ZN)@f1, measured=Im(ZN)@f1, modelled
Im(ZN)@f2, measured=Im(ZN)@f2, modelled
. . .
Im(ZN)@fn, measured=Im(ZN)@fn, modelled
Unknown resistances only:
Re(ZN)@f1, measured=Re(ZN)@f1, modelled
Re(ZN)@f2, measured=Re(ZN)@f2, modelled
. . .
Re(ZN)@fn, measured=Re(ZN)@fn, modelled
All capacitances and resistances unknown:
Im(ZN)@f1, measured=Im(ZN)@f1, modelled
Im(ZN)@f2, measured=Im(ZN)@f2, modelled
. . .
Im(ZN)@fn, measured=Im(ZN)@fn, modelled
Re(ZN)@f1, measured=Re(ZN)@f1, modelled
Re(ZN)@f2, measured=Re(ZN)@f2, modelled
. . .
Re(ZN)@fn, measured=Re(ZN)@fn, modelled.

In various embodiments a vector function defines a set of equations, one at each frequency component of the excitation signal.

It is to be understood that the present invention is not limited to the embodiments described herein and further and additional embodiments within the spirit and scope of the invention will be apparent to the skilled reader from the examples illustrated with reference to the drawings. In particular, the invention may reside in any combination of features described herein, or may reside in alternative embodiments or combinations of these features with known equivalents to given features. Modifications and variations of the example embodiments of the invention discussed above will be apparent to those skilled in the art and may be made without departure of the scope of the invention as defined in the appended claims.

As used herein the article "a" is not intended to be limited have the meaning of "one".

In the preceding description and the following claims the word "comprise" or equivalent variations thereof is used in an inclusive sense to specify the presence of the stated feature or features. This term does not preclude the presence or addition of further features in various embodiments.

It is to be understood that the present invention is not limited to the embodiments described herein and further and additional embodiments within the spirit and scope of the invention will be apparent to the skilled reader from the examples illustrated with reference to the drawings. In particular, the invention may reside in any combination of features described herein, or may reside in alternative embodiments or combinations of these features with known equivalents to given features. Modifications and variations of the example embodiments of the invention discussed above will be apparent to those skilled in the art and may be made without departure of the scope of the invention as defined in the appended claims.

What we claim is:

1. An apparatus, comprising:
an array of sensors comprising N resistor and capacitor pairs, wherein each resistor and capacitor pair is connected:
in parallel with the capacitor of a preceding N−1 resistor and capacitor pair, and
in series with the resistor of the preceding N−1 resistor and capacitor pair; and
a device operable to measure capacitances and/or resistances in the array of sensors, the device being adapted to connect to the array of sensors over a single physical channel provided by two terminals and being operable to provide at the two terminals an excitation signal for the array of sensors, the excitation signal having N frequency components, and operable on data carrying information on a vector function to determine values of capacitance and/or resistances for the array of sensors, the vector function operable to equate at each of the N frequency components:
a) impedance measured at the two terminals;
b) an analytical expression approximating the circuit impedance ZN provided in combination by the array of sensors defined as:

$$Z_N = R_N + \cfrac{1}{j\omega_i C_N + \cfrac{1}{R_{N-1} + \cfrac{1}{j\omega_i C_{N-1} + \cfrac{1}{\ddots \cfrac{}{R_2 + \cfrac{1}{j\omega_i C_2 + \cfrac{1}{R_1 + \cfrac{1}{j\omega_i C_1}}}}}}}}$$

$\omega_i = 2\pi f_i$ where i=1 . . . N, where i=1 . . . N, where $C_1$ is the first capacitance, $C_2$ is the second capacitance, where $C_{N-1}$ is the N−1$^{th}$ capacitance, Cn is the n$^{th}$ capacitance, $R_1$ is the series resistance of the first capacitance, $R_2$ is the resistance of the second capacitance, $R_{N-1}$ is the series resistance of the N−1$^{th}$ capacitance, and $R_N$ is the series resistance of the N$^{th}$ capacitance, where w, is the angular frequency of the excitation signal, $f_i$ is the frequency of the excitation frequency component applied to the circuit described by the impedance ZN, $f_1$ is the first frequency, $f_2$ is the second frequency, $f_{N-1}$ is the N−1$^{th}$ frequency, and $f_N$ is the N$^{th}$ frequency.

2. The apparatus of claim 1 wherein the array of sensors, in combination with the device, comprises N resistances of selected and known value, each resistance being in series with a respective capacitance.

3. The apparatus of claim 1 wherein the array of sensors in combination with the device comprises a set of M resistances of selected and known value and N-M capacitances of selected and known value.

4. The apparatus of claim 1 wherein the array of sensors in combination with the device comprises any number of N or less capacitances to be determined and N or less resistances to be determined and the device is configured to equate both the real components and imaginary components of impedance measured at the two terminals and the analytical expression approximating the circuit.

5. The apparatus of claim 4 wherein the N or less resistances are circuit equivalent resistances to resistances of deformable leads of the array which vary in resistance with deformation.

* * * * *